United States Patent
Kim et al.

(10) Patent No.: US 11,469,283 B2
(45) Date of Patent: Oct. 11, 2022

(54) DISPLAY DEVICE AND METHOD FOR MANUFACTURING THE SAME

(71) Applicant: Samsung Display Co., LTD., Yongin-si (KR)

(72) Inventors: Myoung Hwa Kim, Seoul (KR); Joon Seok Park, Yongin-si (KR); Tae Sang Kim, Seoul (KR); Yeon Keon Moon, Hwaseong-si (KR); Geun Chul Park, Suwon-si (KR); Sang Woo Sohn, Yongin-si (KR); Jun Hyung Lim, Seoul (KR); Hye Lim Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 141 days.

(21) Appl. No.: 16/952,762

(22) Filed: Nov. 19, 2020

(65) Prior Publication Data
US 2021/0327983 A1 Oct. 21, 2021

(30) Foreign Application Priority Data
Apr. 17, 2020 (KR) .................. 10-2020-0046536

(51) Int. Cl.
*H01L 27/32* (2006.01)
*H01L 27/12* (2006.01)
*H01L 29/423* (2006.01)

(52) U.S. Cl.
CPC ...... *H01L 27/3258* (2013.01); *H01L 27/1225* (2013.01); *H01L 27/1237* (2013.01); *H01L 29/42384* (2013.01); *H01L 2227/323* (2013.01)

(58) Field of Classification Search
CPC ............. H01L 27/1225; H01L 27/1237; H01L 29/7869; H01L 29/78693; H01L 29/42384
See application file for complete search history.

(56) References Cited

U.S. PATENT DOCUMENTS

| 11,227,875 B2* | 1/2022 | Kim ................. G09G 3/3258 |
| 2004/0075783 A1* | 4/2004 | Lee .................. H01L 29/42384 |
| | | 257/E29.151 |

(Continued)

FOREIGN PATENT DOCUMENTS

| CN | 110880518 | 7/2021 |
| JP | 2016167585 A | 9/2016 |

(Continued)

OTHER PUBLICATIONS

Extended European Search Report—European Application No. 21168977.3 dated Sep. 14, 2021, citing references listed within.

(Continued)

*Primary Examiner* — Bryan R Junge
(74) *Attorney, Agent, or Firm* — Cantor Colburn LLP

(57) ABSTRACT

A display device is provided. The display device includes a substrate, a first active layer of a first transistor and a second active layer of a second transistor which are disposed on the substrate, a first gate insulating layer disposed on the first active layer, an oxide layer disposed on the first gate insulating layer and including an oxide semiconductor, a first gate electrode disposed on the oxide layer, a second gate insulating layer disposed on the first gate electrode and the second active layer, and a second gate electrode which overlaps the second active layer in a thickness direction of the substrate and is disposed on the second gate insulating layer, where the oxide layer overlaps the first active layer and does not overlap the second active layer in the thickness direction.

20 Claims, 24 Drawing Sheets

(56) References Cited

U.S. PATENT DOCUMENTS

| | | | |
|---|---|---|---|
| 2009/0159894 A1* | 6/2009 | Yasumatsu | H01L 29/4908 257/E31.124 |
| 2011/0240990 A1 | 10/2011 | Yamazaki | |
| 2013/0187150 A1 | 7/2013 | Yamazaki et al. | |
| 2015/0076471 A1* | 3/2015 | Saito | H01L 27/1237 257/40 |
| 2015/0243718 A1 | 8/2015 | Kwon et al. | |
| 2015/0263141 A1* | 9/2015 | Yamazaki | H01L 29/4966 438/104 |
| 2017/0294456 A1* | 10/2017 | Lee | H01L 21/02595 |
| 2018/0286890 A1* | 10/2018 | Suzumura | H01L 27/1218 |
| 2021/0036029 A1* | 2/2021 | Park | H01L 27/1225 |
| 2021/0111197 A1* | 4/2021 | Moon | H01L 27/1255 |
| 2021/0210525 A1* | 7/2021 | Jeong | H01L 27/1237 |
| 2022/0059576 A1* | 2/2022 | Zhao | H01L 27/1237 |

FOREIGN PATENT DOCUMENTS

| | | |
|---|---|---|
| KR | 1020180062278 A | 6/2018 |
| KR | 101901251 B1 | 9/2018 |
| KR | 1020200002050 A | 1/2020 |

OTHER PUBLICATIONS

Rongsheng Chen et al., "Self-aligned top-gate InGaZnO thin film transistors using SiO2Al2O3 stack gate dielectric," Think Solid Films, 2013, pp. 572-575, vol. 548, Elsevier B.V.

* cited by examiner

DISPLAY DEVICE AND METHOD FOR MANUFACTURING THE SAME

This application claims priority to Korean Patent Application No. 10-2020-0046536, filed on Apr. 17, 2020, and all the benefits accruing therefrom under 35 U.S.C. § 119, the content of which in its entirety is herein incorporated by reference.

BACKGROUND

1. Technical Field

The disclosure relates to a display device and a method for manufacturing the same.

2. Description of the Related Art

The importance of a display device has steadily increased with the development of multimedia technology. Accordingly, various types of display devices such as a liquid crystal display ("LCD"), an organic light emitting display ("OLED") and the like have been used.

Among them, the organic light emitting display is a self-light emitting device that emits light by itself and has advantages such as fast response speed, high luminous efficiency and luminance, and a large viewing angle. The organic light emitting display may include a plurality of pixels in a single panel. Each pixel may include an organic light emitting diode (OLED) disposed on a substrate on which a thin film transistor is disposed.

The display device as described above may include a driving transistor and a switching transistor in one sub-pixel. Since the driving transistor and the switching transistor have different roles, the required characteristics of the transistors may be different.

SUMMARY

However, when considering the productivity related to manufacturing cost and time, there is a difficulty in manufacturing the transistors having different characteristics. Aspects of the disclosure provide a display device capable of increasing the driving voltage range of a driving transistor and the mobility of a switching transistor.

Aspects of the disclosure also provide a method for manufacturing a display device capable of increasing the driving voltage range of a driving transistor and the mobility of a switching transistor.

However, aspects of the disclosure are not restricted to those set forth herein. The above and other aspects of the disclosure will become more apparent to one of ordinary skill in the art to which the disclosure pertains by referencing the detailed description of the disclosure given below.

In the display device according to an exemplary embodiment, an oxide layer is provided in a first transistor, not in a second transistor, thereby increasing the driving voltage range of the first transistor and the electron mobility of the second transistor.

Further, in the display device according to an exemplary embodiment, a hydrogen concentration of a first gate insulating layer between a first active layer and a first gate electrode of the first transistor is made lower than a hydrogen concentration of a second gate insulating layer between a second active layer and a second gate electrode of the second transistor, thereby increasing the driving voltage range of the first transistor.

According to an embodiment of the disclosure, a display device includes a substrate, a first active layer of a first transistor and a second active layer of a second transistor which are disposed on the substrate, a first gate insulating layer disposed on the first active layer, an oxide layer disposed on the first gate insulating layer and including an oxide semiconductor, a first gate electrode disposed on the oxide layer, a second gate insulating layer disposed on the first gate electrode and the second active layer, and a second gate electrode which overlaps the second active layer in a thickness direction of the substrate and is disposed on the second gate insulating layer, where the oxide layer overlaps the first active layer and does not overlap the second active layer in the thickness direction.

In an embodiment, the first gate insulating layer may overlap the first active layer and not overlap the second active layer in the thickness direction.

In an embodiment, each of the first active layer and the second active layer may include an oxide semiconductor, and the oxide semiconductor includes at least one of indium (In), gallium (Ga), zinc (Zn), tin (Sn), or hafnium (Hf).

In an embodiment, the oxide semiconductor of the oxide layer may include at least one of indium (In), gallium (Ga), zinc (Zn), tin (Sn), or hafnium (Hf).

In an embodiment, a hydrogen content of the first active layer may be smaller than a hydrogen content of the second active layer, and an oxygen content of the first active layer may be greater than an oxygen content of the second active layer.

In an embodiment, a width of the oxide layer measured in a horizontal direction may be the same as a width of the first gate electrode measured in the horizontal direction, and the horizontal direction may be perpendicular to the thickness direction.

In an embodiment, a width of the oxide layer measured in in a horizontal direction may be smaller than a width of the first gate electrode measured in the horizontal direction, the horizontal direction may be perpendicular to the thickness direction, and both side surfaces of the oxide layer may be in contact with the first gate electrode.

In an embodiment, the first active layer may include a first conductive region, a second conductive region, and a channel region disposed between the first conductive region and the second conductive region, and the oxide layer may overlap the channel region of the first active layer in the thickness direction.

In an embodiment, the display device may further include an interlayer-insulating layer disposed on the first gate electrode and the second gate electrode, and the first transistor may include a first source electrode disposed on the interlayer-insulating layer and in contact with the first conductive region, and a first drain electrode disposed on the interlayer-insulating layer and in contact with the second conductive region.

In an embodiment, the first transistor further may include a first light blocking layer disposed under the first active layer, and the first source electrode may be in contact with the first light blocking layer.

In an embodiment, the second gate insulating layer may be in contact with a top surface of the second active layer, and the second gate electrode may be in contact with a top surface of the second gate insulating layer.

In an embodiment, a minimum thickness of the first gate insulating layer may be greater than a minimum thickness of the second gate insulating layer in the thickness direction.

In an embodiment, a hydrogen concentration of the first gate insulating layer may be lower than a hydrogen concentration of the second gate insulating layer.

In an embodiment, the second gate insulating layer may be disposed on a top surface and side surfaces of the first gate electrode, and disposed on side surfaces of the first gate insulating layer.

According to an embodiment of the disclosure, a method for manufacturing a display device includes forming a first active layer of a first transistor and a second active layer of a second transistor on a substrate, forming a first gate insulating layer and an oxide layer on a channel region of the first active layer, and forming a first gate electrode of the first transistor on the oxide layer, and forming a second gate insulating layer on the second active layer and the first gate electrode, and forming a second gate electrode which overlaps a channel region of the second active layer on the second gate insulating layer in a thickness direction of the substrate, where the oxide layer overlaps the first active layer and does not overlap the second active layer c.

In an embodiment, the first gate insulating layer may overlap the first active layer and does not overlap the second active layer in the thickness direction.

In an embodiment, the method may further comprise before forming the first active layer of the first transistor and the second active layer of the second transistor, forming a first light blocking layer and a second light blocking layer on the substrate, wherein the first light blocking layer overlaps the first active layer, and the second light blocking layer overlaps the second active layer in the thickness direction.

In an embodiment, forming the first gate insulating layer, the oxide layer, and the first gate electrode may include forming a first gate insulating material layer on the substrate, forming an oxide material layer on the first gate insulating material layer, forming a first gate electrode on the oxide material layer, and simultaneously etching the oxide material layer and the first gate insulating material layer using the first gate electrode as a mask.

In an embodiment, a width of the first gate electrode measured in a horizontal direction may be the same as a width of the oxide layer measured in the horizontal direction, and the horizontal direction may be perpendicular to the thickness direction.

In an embodiment, a minimum thickness of the first gate insulating layer may be greater than a minimum thickness of the second gate insulating layer in the thickness direction.

The effects of the disclosure are not limited to the aforementioned effects, and various other effects are included in the present specification.

BRIEF DESCRIPTION OF THE DRAWINGS

The above and other aspects and features of the disclosure will become more apparent by describing in detail exemplary embodiments thereof with reference to the attached drawings, in which.

DETAILED DESCRIPTION

Figure 1:
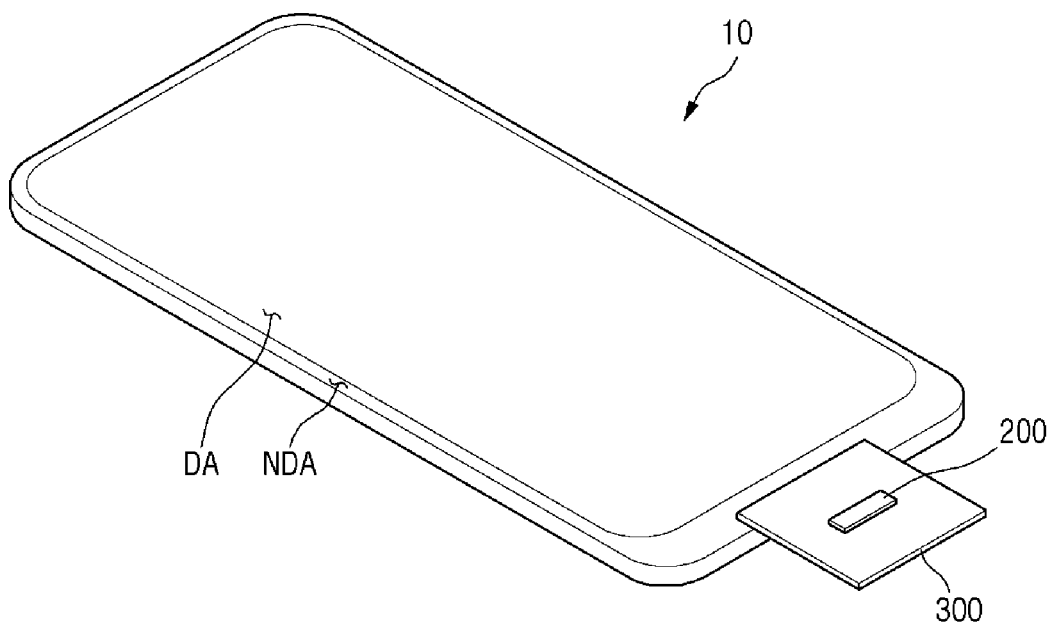
FIG. 1 is a perspective view of a display device according to an exemplary embodiment.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification. It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein. The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below Hereinafter, exemplary embodiments of the disclosure will be described in detail with reference to the accompanying drawings.

Figure 2:
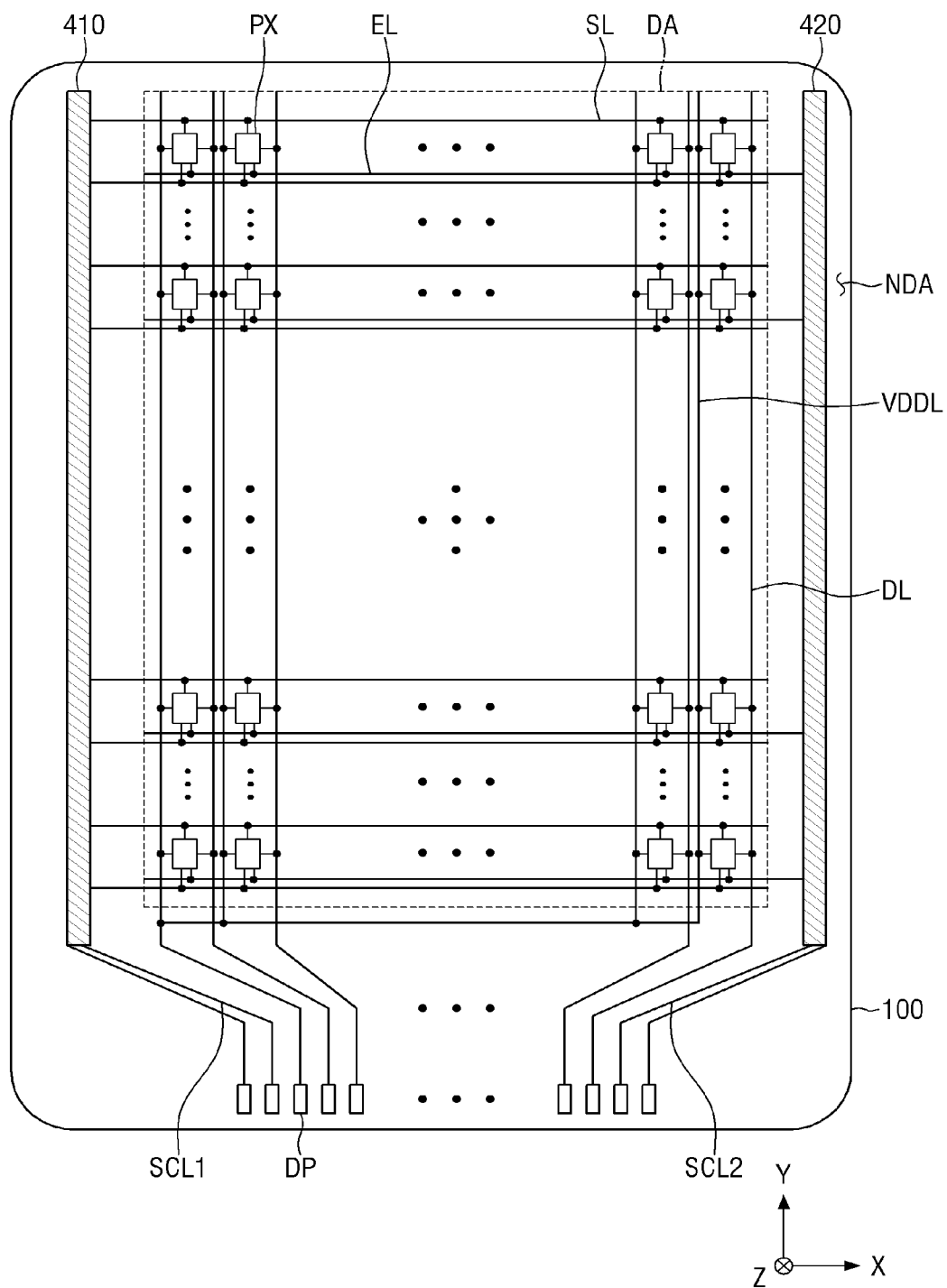
FIG. 2 is a plan view illustrating an example of a display panel according to an exemplary embodiment.

FIG. 1 is a perspective view of a display device according to an exemplary embodiment. FIG. 2 is a plan view illustrating an example of a display panel according to an exemplary embodiment.

Referring to FIGS. 1 to 2, a display device 10 is a device for displaying a moving image or a still image. The display device 10 may be used as a display screen of various devices, such as a television, a laptop computer, a monitor, a billboard and an Internet-of-Things ("IOT") device, as well as a portable electronic device such as a mobile phone, a smartphone, a tablet personal computer ("PC"), a smart watch, a watch phone, a mobile communication terminal, an electronic notebook, an electronic book, a portable multimedia player ("PMP"), a navigation device and an ultra-mobile PC ("UMPC").

The display device 10 according to an exemplary embodiment may include a display panel 100, a display driver 200, and a circuit board 300.

The display panel 100 may be any one of an organic light emitting display panel, a plasma display panel, a field emission display panel, an electrophoretic display panel, a quantum dot light emitting display panel, and a micro LED display panel. In the following description, it is assumed that the display panel 100 is an organic light emitting display panel, but the disclosure according to the invention is not limited thereto.

The display panel 100 may have a rectangular shape, in a plan view, having short sides in an X-axis direction and long sides in a Y-axis direction crossing the X-axis direction. The corner where the short side in the X-axis direction and the long side in the Y-axis direction meet may be rounded to have a predetermined curvature or may be right-angled. The planar shape of the display panel 100 is not limited to a rectangular shape, and may have other polygonal shapes, a circular shape or elliptical shape in another exemplary embodiment. The display panel 100 may be flat. However, without being limited thereto, the display panel 100 may include a curved portion formed at left and right ends and having a predetermined curvature or a varying curvature. In addition, the display panel 100 may be flexible such that it can be bent, folded, or rolled.

The display panel 100 may include a display area DA where sub-pixels PX are disposed to display an image and a non-display area NDA which is a peripheral area of the display area DA. When the display panel 100 includes a curved portion, the display area DA may have a curved portion. In this case, the image of the display panel 100 may also be seen on the curved portion.

As shown in FIG. 2, the sub-pixels PX, scan lines SL connected to the sub-pixels PX, light emitting lines EL, data lines DL, and first driving voltage lines VDDL may be arranged in the display area DA. The scan lines SL and the light emitting lines EL may extend in parallel in the X-axis direction, and the data lines DL may extend in parallel in the Y-axis direction intersecting the X-axis direction. The first driving voltage lines VDDL may extend in parallel along the Y-axis direction in the display area DA. The first driving voltage lines VDDL extended in parallel along the Y-axis direction in the display area DA may be connected to each other in the non-display area NDA.

Each of the sub-pixels PX may be connected to at least one of the scan lines SL, one of the data lines DL, at least one of the light emitting lines EL, and one of the first driving voltage lines VDDL. For simplicity of description, FIG. 2 illustrates that each of the sub-pixels PX is connected to two scan lines SL, one data line DL, one light emitting line EL, and one first driving voltage line VDDL, but the invention is not limited thereto. For example, each of the sub-pixels PX may be connected to three scan lines SL rather than two scan lines SL in another exemplary embodiment.

Each of the sub-pixels PX may include a driving transistor, at least one switching transistor, a light emitting element, and a capacitor. The driving transistor may emit light by supplying a driving current to the light emitting element according to the data voltage applied to the gate electrode of the driving transistor. The driving transistor and the at least one switching transistor may be thin film transistors. The light emitting element may emit light according to the driving current of the driving transistor. The light emitting element may be an organic light emitting diode including a first electrode, an organic light emitting layer and a second electrode. The capacitor may serve to keep constant the data voltage applied to the gate electrode of the driving transistor.

The non-display area NDA may be defined as an area from the boundary of the display area DA to the edge of the display panel 100. A scan driver 410 for applying scan signals to the scan lines SL and pads DP connected to the data lines DL may be disposed in the non-display area NDA. Since the circuit board 300 is attached to the pads DP, the pads DP may be disposed at one edge of the display panel 100, e.g., at the lower edge of the display panel 100.

The scan driver 410 may be connected to the display driver 200 through a plurality of first scan control lines SCL1. The scan driver 410 may receive a scan control signal from the pads DP through the plurality of first scan control lines SCL1. The scan driver 410 may generate scan signals in response to the scan control signal, and output the scan signals sequentially to the scan lines SL. The sub-pixels PX, to which data voltages are to be supplied, are selected by the scan signals from the scan driver 410, and the data voltages are supplied to the selected sub-pixels PX.

An emission control driver 420 may be connected to the display driver 200 through a plurality of second scan control lines SCL2. The emission control driver 420 may receive an emission control signal from the pads DP through the plurality of second scan control lines SCL2. The emission control driver 420 may generate emission signals in response to the emission control signal, and output the emission signals sequentially to the light emitting lines EL.

FIG. 2 illustrates that the scan driver 410 is disposed outside one side of the display area DA, and the emission control driver 420 is disposed outside the other side of the display area DA, but the invention is not limited thereto.

Both the scan driver 410 and the emission control driver 420 may be disposed outside the same side of the display area DA, or outside both sides of the display area DA in another exemplary embodiment.

The display driver 200 receives digital video data and timing signals from the outside. The display driver 200 converts the digital video data into analog positive/negative data voltages and supplies them to the data lines DL. The display driver 200 generates and supplies the scan control signal for controlling an operation timing of the scan driver 410 through the first scan control lines SCL1. The display driver 200 generates and supplies the emission control signal for controlling an operation timing of the emission control driver 420 through the second scan control lines SCL2. In addition, the display driver 200 may supply a first driving voltage to the first driving voltage line VDDL.

The display driver 200 may be formed of an integrated circuit ("IC") and attached onto the circuit board 300 by a chip on film ("COF") method. Alternatively, the display driver 200 may be directly attached onto the display panel 100 by a chip on glass ("COG") method, a chip on plastic ("COP") method, or an ultrasonic bonding method.

The circuit board 300 may be attached onto the pads DP using an anisotropic conductive film. Accordingly, lead wires of the circuit board 300 may be electrically connected to the pads DP. The circuit board 300 may be a flexible film, such as a flexible printed circuit board, a printed circuit board, or a chip on film.

Figure 3:
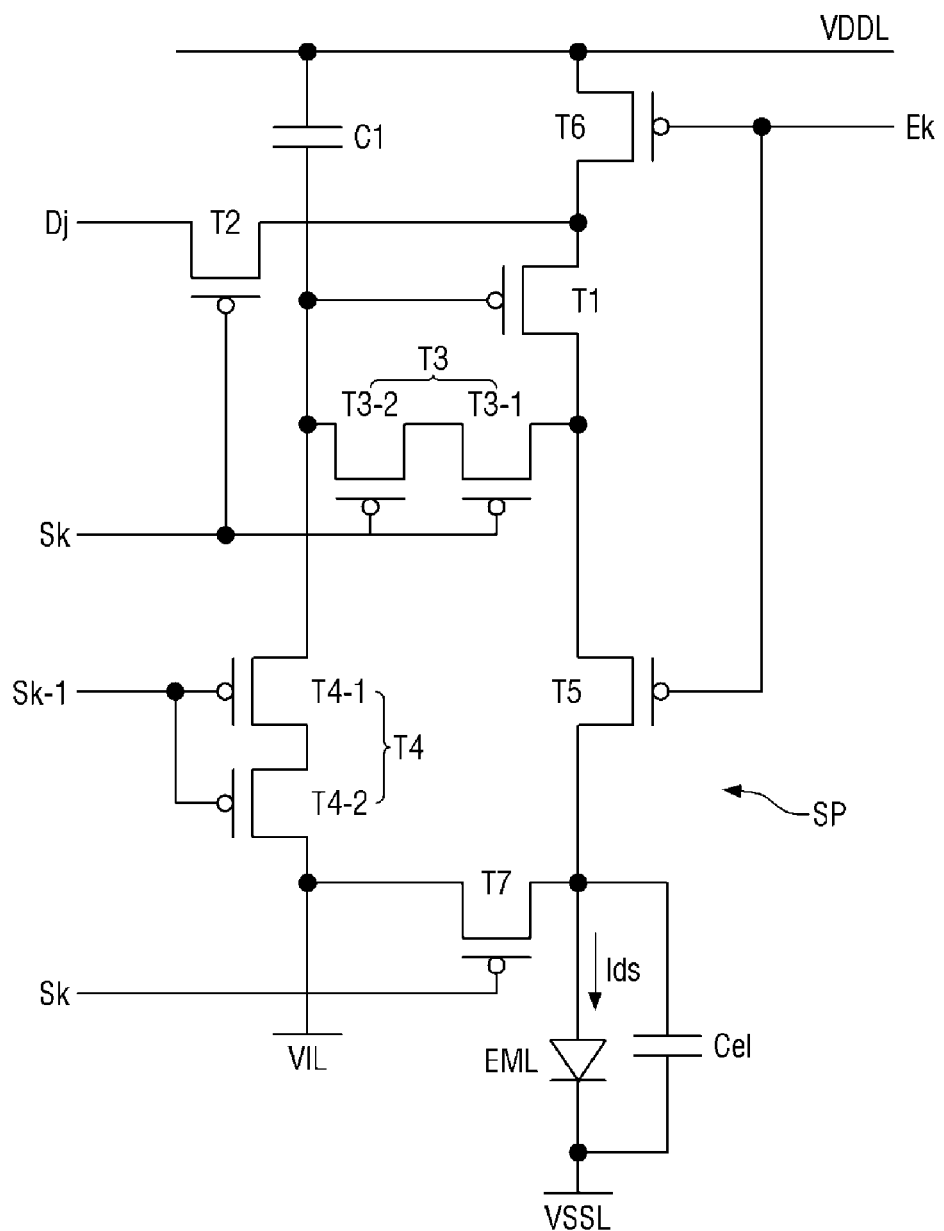
FIG. 3 is a circuit diagram illustrating an example of the sub-pixel of FIG. 2.

FIG. 3 is a circuit diagram illustrating an example of the sub-pixel of FIG. 2.

FIG. 3 exemplarily shows the sub-pixel PX connected to a $(k-1)^{th}$ scan line Sk-1, a $k^{th}$ scan line Sk, and a $j^{th}$ data line Dj.

Referring to FIG. 3, the sub-pixel PX may overlap the $(k-1)^{th}$ scan line Sk-1, the $k^{th}$ scan line Sk, and the $j^{th}$ data line Dj. In addition, the sub-pixel PX may be connected to the first driving voltage line VDDL through which the first driving voltage is applied, an initialization voltage line VIL through which an initialization voltage is applied, and a second driving voltage line VSSL through which a second driving voltage lower than the first driving voltage is applied.

The sub-pixel PX may include a driving transistor, a light emitting element EML, switching elements, and a first capacitor C1. For example, the sub-pixel PX may include a first transistor T1 as the driving transistor, and second to seventh transistors T2 to T7 as the switching elements. However, the sub-pixel PX of the disclosure is not limited to that shown in FIG. 3.

The first transistor T1 may include a first gate electrode, a first source electrode, and a first drain electrode. The first transistor T1 controls drain-source current Ids (hereinafter, referred to as "driving current") based on a data voltage applied to the first gate electrode. The driving current Ids flowing through a channel of the first transistor T1 is proportional to the square of the difference between a threshold voltage and a voltage Vgs between the first gate electrode and the first source electrode of the first transistor T1, as shown in Equation 1:

$$Ids = k' \times (Vgs - Vth)^2 \quad \text{Equation 1}$$

In Equation 1, k' is a proportional coefficient determined by the structure and physical characteristics of the first transistor T1, Vgs is a gate-source voltage of the first transistor T1, and Vth is a threshold voltage of the first transistor T1.

A light emitting element EML emits light by the driving current Ids passing through the light emitting element EML. A light emission amount of the light emitting element EML may be proportional to the driving current Ids. The light emitting element EML may be an organic light emitting diode including a first electrode, a second electrode, and an organic light emitting layer disposed between the first electrode and the second electrode. Alternatively, the light emitting element EML may be an inorganic light emitting element including a first electrode, a second electrode, and an inorganic semiconductor disposed between the first electrode and the second electrode. Alternatively, the light emitting element EML may be a quantum dot light emitting element including a first electrode, a second electrode, and a quantum dot light emitting layer disposed between the first electrode and the second electrode. Alternatively, the light emitting element EML may be a micro light emitting diode.

The first electrode of the light emitting element EML may be connected to the second electrode of the fifth transistor T5, and the second electrode of the light emitting element EML may be connected to the second driving voltage line VSSL. A parasitic capacitance Cel may be formed between an anode electrode (i.e., the first electrode) and a cathode electrode (i.e., the second electrode) of the light emitting element EML.

The second transistor T2 is turned on by a scan signal of the $k^{th}$ scan line Sk to connect the first source electrode of the first transistor T1 to the $j^{th}$ data line Dj. The second transistor T2 may include a second gate electrode, a second source electrode, and a second drain electrode. The second gate electrode of the second transistor T2 may be connected to the $k^{th}$ scan line Sk, the second drain electrode may be connected to the first source electrode of the first transistor T1, and the second source electrode may be connected to the $j^{th}$ data line Dj.

The third transistor T3 may be formed as a dual transistor consisting of a third-first transistor T3-1 and a third-second transistor T3-2. The third-first transistor T3-1 and the third-second transistor T3-2 are turned on by the scan signal of the $k^{th}$ scan line Sk to connect the first gate electrode of the first transistor T1 to the first drain electrode thereof. That is, when the third-first transistor T3-1 and the third-second transistor T3-2 are turned on, since the first gate electrode and the first drain electrode of the first transistor T1 are connected to each other, the first transistor T1 acts as a diode. The third-first transistor T3-1 may include a third-first gate electrode, a third-first source electrode, and a third-first drain electrode. The third-first gate electrode may be connected to the $k^{th}$ scan line Sk, the third-first source electrode may be connected to the first drain electrode of the first transistor T1, and the third-first drain electrode may be connected to a third-second source electrode of the third-second transistor T3-2. The third-second transistor T3-2 may include a third-second gate electrode, the third-second source electrode, and a third-second drain electrode. The third-second gate electrode may be connected to the $k^{th}$ scan line Sk, the third-second source electrode may be connected to the third-first drain electrode of the third-first transistor T3-1, and the third-second drain electrode may be connected to the first gate electrode of the first transistor T1.

The fourth transistor T4 may be formed as a dual transistor consisting of a fourth-first transistor T4-1 and a fourth-second transistor T4-2. The fourth-first transistor T4-1 and the fourth-second transistor T4-2 are turned on by a scan signal of the $(k-1)^{th}$ scan line Sk-1 to connect the first gate electrode of the first transistor T1 to the initialization voltage line VIL. Therefore, the first gate electrode of the first transistor T1 may be discharged to an initialization voltage of the initialization voltage line VIL. The fourth-first transistor T4-1 may include a fourth-first gate electrode, a fourth-first source electrode, and a fourth-first drain electrode. The fourth-first gate electrode may be connected to the $(k-1)^{th}$ scan line Sk-1, the fourth-first source electrode may be connected to the first gate electrode of the first transistor T1, and the fourth-first drain electrode may be connected to a fourth-second source electrode of the fourth-second transistor T4-2. The fourth-second transistor T4-2 may include a fourth-second gate electrode, the fourth-second source electrode, and a fourth-second drain electrode. The fourth-second gate electrode may be connected to the $(k-1)^{th}$ scan line Sk-1, the fourth-second source electrode may be connected to the fourth-first drain electrode of the fourth-first transistor T4-1, and the fourth-second drain electrode may be connected to the initialization voltage line VIL.

The fifth transistor T5 is connected between the first drain electrode of the first transistor T1 and the anode electrode of the light emitting element EML. The fifth transistor T5 is turned on by an emission control signal of a $k^{th}$ light emitting line Ek to connect the first drain electrode of the first transistor T1 to the anode electrode of the light emitting element EML. The fifth transistor T5 may include a fifth gate electrode, a fifth source electrode, and a fifth drain electrode. The fifth gate electrode is connected to the $k^{th}$ light emitting line Ek, the fifth source electrode is connected to the first drain electrode of the first transistor T1, and the fifth drain electrode is connected to the anode electrode of the light emitting element EML.

The sixth transistor T6 is turned on by the emission control signal of the $k^{th}$ light emitting line Ek to connect the first source electrode of the first transistor T1 to the first driving voltage line VDDL. The sixth transistor T6 may include a sixth gate electrode, a sixth source electrode, and a sixth drain electrode. The sixth gate electrode is connected to the $k^{th}$ light-emitting line Ek, the sixth source electrode is connected to the first driving voltage line VDDL, and the sixth drain electrode is connected to the first source electrode of the first transistor T1. When the fifth transistor T5 and the sixth transistor T6 are both turned on, the driving current Ids may be supplied to the light emitting element EML.

The seventh transistor T7 is turned on by the scan signal of the $k^{th}$ scan line Sk to connect the anode electrode of the light emitting element EML to the initialization voltage line VIL. The anode electrode of the light emitting element EML may be discharged to an initialization voltage. The seventh transistor T7 may include a seventh gate electrode, a seventh source electrode, and a seventh drain electrode. The seventh gate electrode is connected to the $k^{th}$ scan line Sk, the seventh source electrode is connected to the anode electrode of the light emitting element EML, and the seventh drain electrode is connected to the initialization voltage line VIL.

The above-described first transistor T1 may be a driving transistor, and the second to seventh transistors T2 to T7 may be switching transistors. The driving transistor plays a role of allowing the driving current to flow stably, so that it is required to have a large driving voltage range characteristic. On the other hand, the switching transistor plays a role of switching on and off, so that it is required to have a fast reaction rate, i.e., high mobility. In an embodiment, it is possible to provide a display device capable of increasing the driving voltage range of the driving transistor and the mobility of the switching transistor. A more detailed description will be given later.

The first capacitor C1 is provided between the first gate electrode of the first transistor T1 and the first driving voltage line VDDL. One electrode of the first capacitor C1 may be connected to the first gate electrode of the first transistor T1, and the other electrode of the first capacitor C1 may be connected to the first driving voltage line VDDL.

An active layer of each of the first to seventh transistors T1 to T7 may be made of an oxide semiconductor including indium (In), gallium (Ga), and oxygen (O). Further, in FIG. 3, each of the first to seventh transistors T1 to T7 is mainly described as being formed of a p-type metal oxide semiconductor field effect transistor ("MOSFET"), but the invention is not limited thereto, and may be formed of an n-type MOSFET in another exemplary embodiment.

Figure 4:
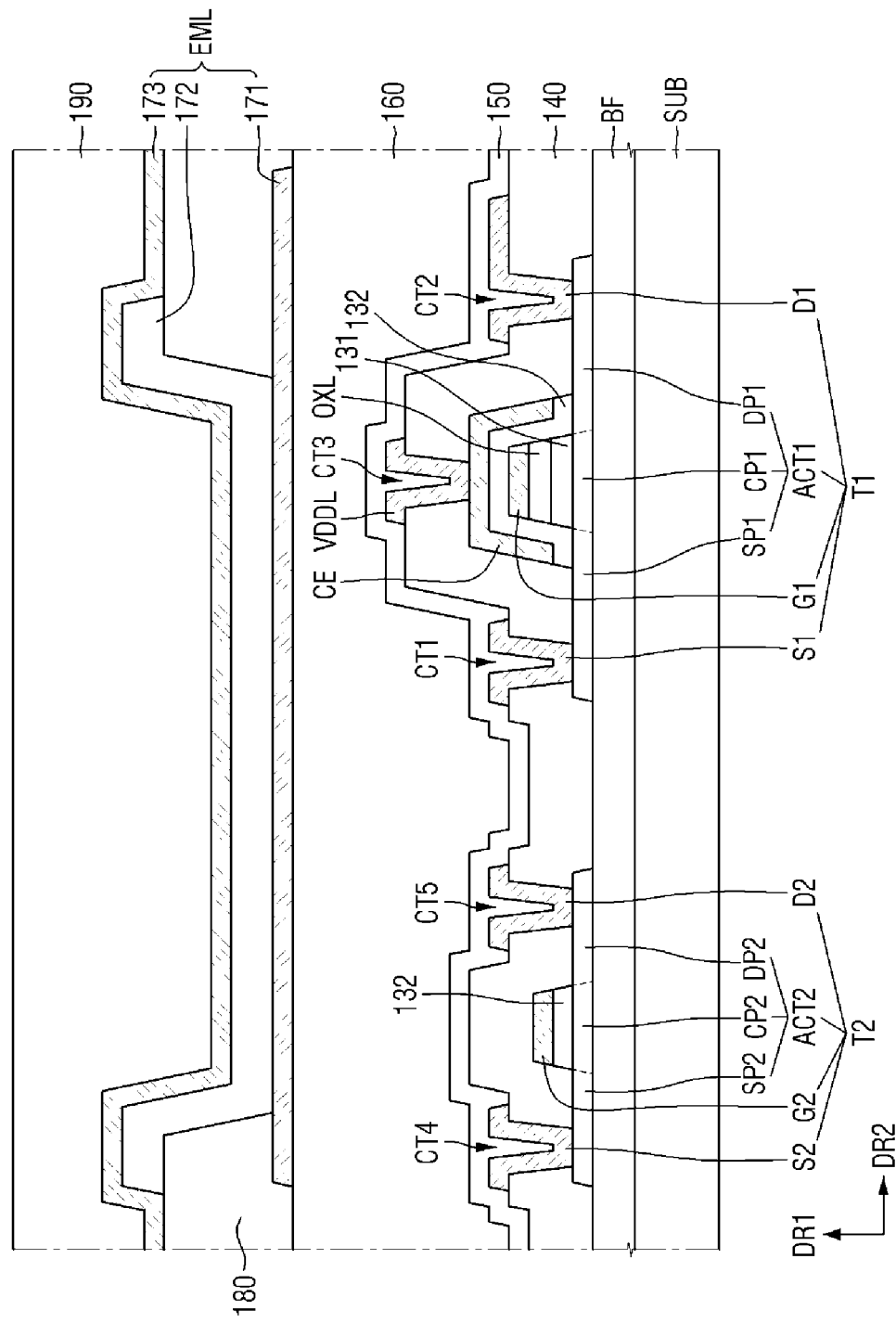
FIG. 4 is a cross-sectional view illustrating an example of the first transistor and the second transistor of FIG. 3.

FIG. 4 is a cross-sectional view illustrating an example of the first transistor and the second transistor of FIG. 3.

Referring to FIG. 4, a display device according to an embodiment may include a first transistor T1, a second transistor T2, and a light emitting element EML, arranged on a substrate SUB. In particular, an oxide layer OXL including an oxide semiconductor may be disposed only in the first transistor T1, not in the second transistor T2. Hereinafter, the display device will be described in detail.

The substrate SUB may be a rigid substrate or a flexible substrate which can be bent, folded or rolled. The substrate SUB may be formed of or include an insulating material such as glass, quartz, or a polymer resin.

A buffer layer BF may be disposed on the substrate SUB. The buffer layer BF may be disposed on the substrate SUB to protect the transistors T1 and T2 and a light emitting layer 172 from moisture penetrating through the substrate SUB susceptible to moisture permeation. The buffer layer BF may be a single layer of any one of silicon oxide (SiOx), silicon nitride (SiNx), and silicon nitride oxide (SiOxNy), or a multilayer in which two or more inorganic layers among them are alternately stacked. For example, the buffer layer BF may be a multilayer of silicon nitride and silicon oxide, in which the thickness of silicon oxide may be thicker than that of silicon nitride. The buffer layer BF may be omitted.

The first transistor T1 and the second transistor T2 may be disposed on the buffer layer BF. The first transistor T1 may include a first active layer ACT1, a first gate electrode G1, a first source electrode S1, and a first drain electrode D1. The second transistor T2 may include a second active layer ACT2, a second gate electrode G2, a second source electrode S2, and a second drain electrode D2.

Specifically, the first active layer ACT1 and the second active layer ACT2 may be disposed on the buffer layer BF. The first active layer ACT1 and the second active layer ACT2 may be made of or include an oxide semiconductor including oxygen (O) and at least one of indium (In), gallium (Ga), zinc (Zn), tin (Sn), hafnium (Hf), or titanium (Ti). For example, each of the first active layer ACT1 and the second active layer ACT2 may be made of or include any one of ITO (indium (In), tin (Sn), oxygen (O)), IGZO (indium (In), gallium (Ga), zinc (Zn), and oxygen (O)), IGZTO (indium (In), gallium (Ga), zinc (Zn), tin (Sn) and oxygen (O)), and IGTO (indium (In), gallium (Ga), tin (Sn) and oxygen (O)).

The first active layer ACT1 and the second active layer ACT2 includes substantially the same material, but may have different compositions by an oxide layer disposed thereon, as will be described later. The oxide layer OXL including the oxide semiconductor may be provided on the first active layer ACT1, but may not be provided on the second active layer ACT2. The oxide layer OXL may function as an oxygen supply layer for injecting oxygen into the first active layer ACT1 during the manufacturing process of the display device.

Each of the first active layer ACT1 and the second active layer ACT2 may include a first conductive region SP1, SP2, a second conductive region DP1, DP2, and a channel region CP1, CP2. The channel region CP1, CP2 may be disposed between the first conductive region SP1, SP2 and the second conductive region DP1, DP2. The source electrode S1, S2 and the drain electrode D1, D2, which will be described later, may be in contact with the first conductive region SP1, SP2 and the second conductive region DP1, DP2, respectively.

A first gate insulating layer 131 may be disposed on the first active layer ACT1. The first gate insulating layer 131 may be disposed on a portion of the first active layer ACT1. The first gate insulating layer 131 may be an inorganic layer, e.g., silicon oxide.

The oxide layer OXL may be disposed on the first gate insulating layer 131. The oxide layer OXL may include an oxide semiconductor. The oxide semiconductor of the oxide layer OXL may be made of the same material as the oxide semiconductor of the first active layer ACT1. However, the invention is not limited thereto, and the oxide semiconductors may be different in another exemplary embodiment.

The oxide layer OXL of the first transistor T1 may be disposed on the first gate insulating layer 131 to overlap the first active layer ACT1 in a plan view. The oxide layer OXL may be disposed to overlap at least the channel region CP1 of the first active layer ACT1. A width of the oxide layer OXL measured in one direction (i.e., second direction DR2 in FIG. 4) may be shorter than a width of the first active layer ACT1 measured in one direction, but may be longer than a width of the channel region CP1 of the first active layer ACT1. In the drawing, the width of the oxide layer OXL is shown to be substantially the same as the channel region CP1 of the first active layer ACT1, but the invention is not limited thereto.

According to an embodiment, the oxide layer OXL may be an oxygen supply layer for injecting oxygen (O) into the channel region CP1 of the first active layer ACT1. In the oxide semiconductor, an oxygen defect region may be partially formed due to an oxygen partial pressure in a deposition process. When the insulating layer is deposited on the oxide semiconductor, hydrogen (H) may be injected into the oxygen defect region, which may increase the mobility of the oxide semiconductor. The active layer having the oxide semiconductor may have a large amount of oxygen defect region so as to have high mobility. However, in this case, due to an excessive increase in carrier concentration, it may be difficult for the first transistor T1 serving as the driving transistor to secure a driving voltage for driving each pixel.

The oxide layer OXL may supply excess oxygen (O) to other adjacent layers, e.g., to the first gate insulating layer 131. The excess oxygen (O) supplied to the first gate insulating layer 131 may be injected into the channel region CP1 of the first active layer ACT1 which is the oxide semiconductor, and hydrogen (H) penetrated into the oxygen defect region may be discharged back to the first gate insulating layer 131. In this case, the number of carriers contained in the first active layer ACT1 which is the oxide semiconductor may be reduced, and a range of the driving voltage of the first transistor T1 serving as the driving transistor may be secured. On the other hand, in the case of the second transistor T2 serving as the switching transistor, the oxygen supply layer is not provided on the second active layer ACT2, so that the second transistor T2 may have high mobility.

According to an embodiment, the first transistor T1 may include the oxide layer OXL disposed on the first active layer ACT1 to improve device characteristics. In a driving voltage-driving current graph, as the slope of the curve decreases, the first transistor T1 including the oxide layer OXL may secure a wide range of driving voltage to drive the light emitting element EML of a pixel. Further, since the second gate electrode G2 rather than the oxide layer is disposed on the second active layer ACT2, the second transistor T2 may secure high mobility of electrons in the channel region CP2.

Figure 5:
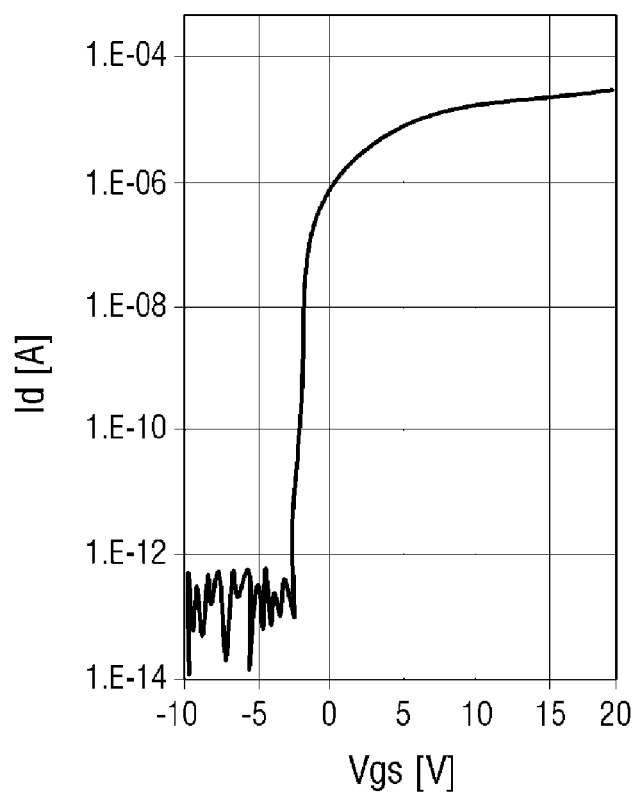
FIG. 5 is a graph showing a driving current with respect to a gate-source voltage of the first transistor according to an exemplary embodiment.
Figure 6:
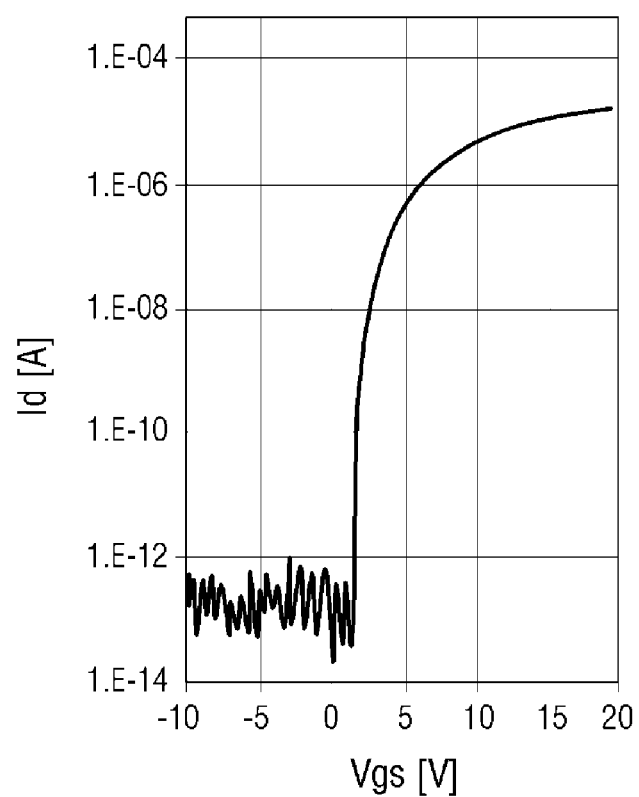
FIG. 6 is a graph showing a driving current with respect to a gate-source voltage of the second transistor according to an exemplary embodiment.

FIG. 5 is a graph showing a driving current with respect to a gate-source voltage of the first transistor according to an exemplary embodiment. FIG. 6 is a graph showing a driving current with respect to a gate-source voltage of the second transistor according to an exemplary embodiment. FIG. 5 is a graph showing a driving current Id with respect to a gate-source voltage Vgs of the first transistor T1 including the oxide layer OXL according to an exemplary embodiment. FIG. 6 is a graph showing a driving current Id with respect to a gate-source voltage Vgs of the second transistor T2 having no oxide layer according to an exemplary embodiment.

Referring to FIGS. 5 and 6, as illustrated in FIG. 5, when the first transistor T1 serving as the driving transistor further includes an oxide layer OXL, the curve may have a gentle slope in the graph of the driving current Id with respect to the gate-source voltage Vgs. Accordingly, in the first transistor T1, the range of the gate-source voltage Vgs required for the driving current Id of the predetermined range may be widened. In this case, the electron mobility of the first transistor T1 was found to be 3.65 square centimeters per voltage-second ($cm^2$/Vs), the driving voltage range to be 2.88 voltages (V), the threshold voltage Vth to be 1.60V and the slope (subthreshold slope) of the curve in the graph to be 0.37. In other words, the first transistor T1 according to an embodiment may secure a wide range of driving voltage for driving the pixel. In particular, the width of the channel region CP1 of the first transistor T1 may be narrowed to enable the display device to realize a high-resolution display including a larger number of pixels. The first transistor T1 according to an embodiment may secure a wide range of driving voltage even if it has a narrow channel region CP1, by including the oxide layer OXL.

As shown in FIG. 6, in the case of the second transistor T2 serving as the switching transistor having no oxide layer, the slope of the curve may be steeper than that in FIG. 5. In this case, the electron mobility of the second transistor T2 was found to be 8.83 $cm^2$/Vs, the driving voltage range to be 1.71V, the threshold voltage Vth to be −0.84V, and the slope (subthreshold slope) of the curve in the graph to be 0.34. In other words, the second active layer ACT2 of the second transistor T2 may have high electron mobility in the channel region CP2, and may exhibit an excellent response speed when the gate voltage is applied.

As shown in FIGS. 5 and 6, in the first transistor T1, the slope of the curve of the driving current with respect to the gate-source voltage has decreased and the driving voltage range has increased, compared to the second transistor T2. That is, the first transistor T1 may include the oxide layer OXL to increase the driving voltage range thereof. The electron mobility of the second transistor T2 has increased compared to that of the first transistor T1. That is, the second transistor T2 may not include the oxide layer OXL to improve the electron mobility thereof. As a result, the display device according to an embodiment may increase the driving voltage range of the first transistor T1 and improve the electron mobility of the second transistor T2 by providing the oxide layer OXL on the first transistor T1 serving as the driving transistor, not on the second transistor T2.

Referring back to FIG. 4, the oxide layer OXL according to an embodiment may include oxygen (O) and at least one of indium (In), gallium (Ga), zinc (Zn), tin (Sn), and hafnium (Hf). In some embodiments, the oxide layer OXL may be TZO (tin, zinc, oxygen) TGO (tin, gallium, oxygen), ITZO (indium, tin, zinc, oxygen), ITGO (indium, tin, gallium, oxygen), or ITZGO (indium, tin, zinc, gallium, oxygen). However, the invention is not limited thereto.

The oxide layer OXL may overlap at least the channel region CP1 of the first active layer ACT1 in a first direction DR1 to inject excess oxygen (O) into the channel region CP1 of the first active layer ACT1. Since the oxide layer OXL provided on the first gate insulating layer 131 has a width in a second direction DR2 greater than that of the channel region CP1 of the first active layer ACT1, the oxide layer OXL may be disposed to overlap with the entire region of the channel region CP1. However, the disclosure according to the invention is not limited thereto, and as shown in the drawing, the width of the oxide layer OXL may be substantially the same as the width of the channel region CP1 of the first active layer ACT1. Here, the first direction DR1 corresponds to the thickness direction of the substrate SUB and corresponds to the Z-axis direction in FIGS. 1 and 2, and the second direction DR2 is perpendicular to the first direction DR1 and parallel to a plane (major surface of the substrate SUB) defined by the X-axis direction and the Y-axis direction in FIGS. 1 and 2.

According to an embodiment, the first active layer ACT1 of the first transistor T1 and the second active layer ACT2 of the second transistor T2 may have the same oxide semiconductor, but different composition ratios. As the oxide layer OXL is disposed on the first active layer ACT1, excess oxygen (O) of the oxide layer OXL may be injected into the first active layer ACT1, and hydrogen (H) present in the oxygen defect region may be discharged. Accordingly, the first active layer ACT1 may have a higher oxygen content than the oxide layer OXL, and the oxide layer OXL may have a higher hydrogen content than the first active layer ACT1.

According to an embodiment, the first active layer ACT1 may have a larger content of oxygen (O) than the second active layer ACT2. In addition, the first active layer ACT1 may have a smaller content of hydrogen (H) than the second active layer ACT2. Since the oxide layer OXL is provided on the first active layer ACT1, oxygen may be injected and hydrogen may be discharged during the manufacturing process. On the other hand, since the oxide layer OXL is not provided on the second active layer ACT2, oxygen and hydrogen may be rarely injected and discharged. The first active layer ACT1 and the second active layer ACT2 includes the same material in the same process, but may have different compositions by the oxide layer OXL provided in the subsequent process. The first transistor T1 according to an embodiment may secure a wide range of driving voltage by including a first active layer ACT1 having a high content of oxygen (O). The second transistor T2 may have high electron mobility by including the second active layer ACT2 having a high content of hydrogen (H).

The first gate electrode G1 may be disposed on the oxide layer OXL. The first gate electrode G1 may be a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

The second gate insulating layer 132 may be disposed on the second active layer ACT2 and the first gate electrode G1. The second gate insulating layer 132 may be disposed on a portion of the second active layer ACT2. The second gate insulating layer 132 may be disposed in contact with the top surface and side surfaces of the first gate electrode G1. The second gate insulating layer 132 may be disposed in contact with the side surfaces of the first gate insulating layer 131. The second gate insulating layer 132 may contact the top surface of the second active layer ACT2. The second gate insulating layer 132 may be disposed on a portion of the first conductive region SP1 and a portion of the second conductive region DP1. The portion of the first conductive region SP1 and the portion of the second conductive region DP1 may be adjacent to the first channel region CP1. The second gate insulating layer 132 may be formed of or include an inorganic layer, e.g., silicon oxide.

The second gate electrode G2 and a capacitor electrode CE may be disposed on the second gate insulating layer 132. In an embodiment, the second gate electrode G2 may be disposed to overlap the second active layer ACT2 in a plan view, and the capacitor electrode CE may be disposed to overlap the first active layer ACT1. The second gate electrode G2 may directly contact the top surface of the second gate insulating layer 132. The second gate electrode G2 and the capacitor electrode CE may be a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

A portion of the second active layer ACT2 overlapping the second gate electrode G2 in a first direction DR1 may be defined as the channel region CP2. The first conductive region SP2 may be disposed on one side of the channel region CP2, and the second conductive region DP2 may be disposed on the other side of the channel region CP2.

The capacitor electrode CE may overlap the first gate electrode G1 in the first direction DR1 (i.e., in a plan view). The capacitor electrode CE may be one electrode of the first capacitor (C1 in FIG. 3) connected to the first driving voltage line VDDL. The capacitor electrode CE may be disposed on the top surface of the second gate insulating layer 132 disposed on the top surface of the first gate electrode G1. The capacitor electrode CE may be disposed on the side surfaces of the second gate insulating layer 132 disposed on the side surfaces of the first gate electrode G1. The capacitor electrode CE may overlap the top surface of the first gate electrode G1 in the first direction DR1. The capacitor electrode CE may overlap the side surfaces of the first gate electrode G1 in the second direction DR2.

As described above, since the first transistor T1 is the driving transistor, the first transistor T1 is preferable to have a wide range of driving voltage.

Oxygen (O) in the first gate insulating layer 131 serves to trap electrons in the channel region CP1 of the first active layer ACT1. Since hydrogen (H) present in the first gate insulating layer 131 is to be bonded to oxygen (O), as the concentration of hydrogen (H) in the first gate insulating layer 131 decreases, electron traps by oxygen (O) may increase in the channel region CP1. Further, as the hydrogen (H) concentration in the first gate insulating layer 131 increases, electron traps by oxygen (O) may decrease in the channel region CP1.

Accordingly, when the hydrogen (H) concentration in the first gate insulating layer 131 is low, electron traps by oxygen (O) in the channel region CP1 increase, such that the driving current curve of the first transistor T1 may have a gentle slope. Therefore, the driving voltage range of the first transistor T1 may be widened. On the other hand, when the hydrogen (H) concentration in the first gate insulating layer 131 is high, electron traps by oxygen (O) in the channel region CP1 decreases, such that the driving current curve of the first transistor T1 may have a steep slope. Therefore, the driving voltage range of the first transistor T1 may be narrowed.

Since the first transistor T1 is the driving transistor, the driving voltage range thereof is preferable to be wide. To this end, the hydrogen concentration in the first gate insulating layer 131 may be less than $5 \times 10^{20}$ atom per cubic centimeters (atom/cm$^3$). On the other hand, since the second transistor T2 is the switching transistor, the driving voltage range thereof may not be wide. To this end, the hydrogen concentration in the second gate insulating layer 132 may be $5 \times 10^{20}$ atom/cm$^3$ or more. That is, the hydrogen concentration in the first gate insulating layer 131 may be lower than that in the second gate insulating layer 132.

An interlayer-insulating layer 140 may be disposed on the second gate electrode G2 and the capacitor electrode CE. The interlayer-insulating layer 140 may be disposed on the remaining portion except for a portion of the first conductive region SP1 in the first active layer ACT1 and the remaining portion except for a portion of the second conductive region DP1 in the first active layer ACT1. The interlayer-insulating layer 140 may be disposed on the first conductive region SP2 and the second conductive region DP2 of the second active layer ACT2. The interlayer-insulating layer 140 may be disposed on the buffer layer BF that is not covered by the first active layer ACT1 and the second active layer ACT2. The interlayer-insulating layer 140 may be an inorganic layer, e.g., a single layer of any one of silicon oxide (SiOx), silicon nitride (SiNx), and silicon nitride oxide (SiOxNy), or a multilayer in which two or more inorganic layers among them are alternately stacked.

The first source electrode S1 and the first drain electrode D1 connected to the first active layer ACT1, and the second source electrode S2 and the second drain electrode D2 connected to the second active layer ACT2 may be disposed on the interlayer-insulating layer 140. Further, the first driving voltage line VDDL connected to the capacitor electrode CE may be disposed on the interlayer-insulating layer 140.

The first source electrode S1, the first drain electrode D1, the second source electrode S2, the second drain electrode D2, and the first driving voltage line VDDL may be a single layer or multiple layers composed of any one or an alloy of molybdenum (Mo), aluminum (Al), chromium (Cr), gold (Au), titanium (Ti), nickel (Ni), neodymium (Nd) and copper (Cu).

A first contact hole CT1 may penetrate the interlayer-insulating layer 140 to expose the first conductive region SP1 of the first active layer ACT1. The first source electrode S1 may be connected to the first conductive region SP1 through the first contact hole CT1. A second contact hole CT2 may penetrate the interlayer-insulating layer 140 to expose the second conductive region DP1 of the first active layer ACT1. The first drain electrode D1 may be connected to the second conductive region DP1 through the second contact hole CT2. A third contact hole CT3 may penetrate the interlayer-insulating layer 140 to expose the capacitor electrode CE. The first driving voltage line VDDL may be connected to the capacitor electrode CE through the third contact hole CT3. A fourth contact hole CT4 may penetrate the interlayer-insulating layer 140 to expose the first conductive region SP2 of the second active layer ACT2. The second source electrode S2 may be connected to the first conductive region SP2 through the fourth contact hole CT4. A fifth contact hole CT5 may penetrate the interlayer-insulating layer 140 to expose the second conductive region DP2 of the second active layer ACT2. The second drain electrode D2 may be connected to the second conductive region DP2 through the fifth contact hole CT5.

In this way, the first transistor T1 may be configured to include the first active layer ACT1, the oxide layer OXL, the first gate electrode G1, the first source electrode S1, and the first drain electrode D1. The second transistor T2 may be configured to include the second active layer ACT2, the second gate electrode G2, the second source electrode S2, and the second drain electrode D2.

A passivation layer 150 may be disposed on the first transistor T1 and the second transistor T2. Specifically, the passivation layer 150 may be disposed on the first source electrode S1, the first drain electrode D1, the second source electrode S2, the second drain electrode D2, and the first driving voltage line VDDL. The passivation layer 150 may be an inorganic layer, e.g., a single layer of any one of silicon oxide (SiOx), silicon nitride (SiNx), and silicon nitride oxide (SiOxNy), or a multilayer in which two or more inorganic layers among them are alternately stacked.

A planarization layer 160 may be disposed on the passivation layer 150 to flatten the height difference due to the first transistor T1 and the second transistor T2. The planarization layer 160 may be an organic layer such as acryl resin, epoxy resin, phenolic resin, polyamide resin, polyimide resin and the like.

FIG. 4 illustrates the first transistor T1 and the second transistor T2 formed by a top gate method, but the disclosure according to the invention is not limited thereto. That is, the first transistor T1 and the second transistor T2 may be formed by a bottom gate method in which the gate electrode is positioned under the active layer or by a double gate method in which the gate electrode is positioned both above and under the active layer in another exemplary embodiment.

A pixel defining layer 180 and a light emitting element EML including a first electrode 171, a light emitting layer 172, and a second electrode 173 may be disposed on the planarization layer 160.

A contact hole penetrating the planarization layer 160 to expose the drain electrode of the fifth transistor (T5 in FIG. 3) may be defined in the planarization layer 160. The first electrode 171 may be connected to the drain electrode of the fifth transistor (T5 in FIG. 3) through the contact hole.

The first electrode 171 may include a metal material having high reflectivity in a top emission structure in which light is emitted toward the second electrode 173 with respect to the light emitting layer 172. For example, the first electrode 171 may be formed of or include a metal material such as a stacked structure (Ti/Al/Ti) of aluminum (Al) and titanium (Ti), a stacked structure ("ITO"/Al/ITO) of Al and ITO, an APC alloy, a stacked structure (ITO/APC/ITO) of an APC alloy and ITO, or the like. The APC alloy is an alloy of silver (Ag), palladium (Pd) and copper (Cu). Alternatively, the first electrode 171 may be a single layer of molybdenum (Mo), titanium (Ti), copper (Cu), or aluminum (Al).

The pixel defining layer 180 may partition the first electrode 171 on the planarization layer 160 to define an emission area EA of each of the sub-pixels PX. To this end, the pixel defining layer 180 may cover the edge of the first electrode 171. The emission area EA of each of the sub-pixels PX represents a region in which the first electrode 171, the light emitting layer 172, and the second electrode 173 are sequentially stacked and holes from the first electrode 171 and electrons from the second electrode 173 are coupled to each other to emit light in the light emitting layer 172. The pixel defining layer 180 may be an organic layer such as acryl resin, epoxy resin, phenolic resin, polyamide resin, polyimide resin or the like.

The light emitting layer 172 may be disposed on the first electrode 171 and the pixel defining layer 180. The light emitting layer 172 may include an organic material to emit light in a predetermined color. For example, the light emitting layer 172 may include a hole transporting layer, a light emitting layer, and an electron transporting layer. In addition, the light emitting layer 172 may have a tandem structure of two or more stacks, in which case a charge generating layer may be disposed between the stacks.

The second electrode 173 may be disposed on the light emitting layer 172. The second electrode 173 may cover the light emitting layer 172. The second electrode 173 may be a common layer commonly disposed in the sub-pixels PX.

The second electrode 173 may be formed of or include a transparent conductive material ("TCO") such as ITO or IZO that can transmit light in the top emission structure, or a semi-transmissive conductive material such as magnesium (Mg), silver (Ag), or an alloy of magnesium (Mg) and silver (Ag). When the second electrode 173 is formed of a semi-transmissive metal material, the light emission efficiency can be increased due to a micro-cavity effect.

An encapsulation layer 190 may be disposed on the second electrode 173. The encapsulation layer 190 may include at least one inorganic layer to prevent oxygen or moisture from penetrating into the light emitting layer 172 and the second electrode 173. In addition, the encapsulation layer 190 may include at least one organic layer to protect the light emitting layer 172 from foreign substances such as dust. Alternatively, instead of the encapsulation layer 190, a substrate may be disposed on the second electrode 173, and a space between the second electrode 173 and the substrate may be empty in a vacuum state, or a filling film may be disposed therein. The filling film may be an epoxy filling film or a silicone filling film.

According to the embodiment illustrated in FIG. 4, by selectively forming the oxide layer OXL on the first transistor T1 and not on the second transistor T2, it is possible to increase the driving voltage range of the first transistor T1 and the electron mobility of the second transistor T2.

In addition, the concentration of hydrogen (H) in the first gate insulating layer 131 between the first active layer ACT1 and the first gate electrode G1 of the first transistor T1 is made lower than the concentration of hydrogen in the second gate insulating layer 132 between the second active layer ACT2 and the second gate electrode G2 of the second transistor T2. As the hydrogen concentration of the first gate insulating layer 131 decreases, electron traps by oxygen in the first gate insulating layer 131 may increase. Therefore, the driving voltage range of the first transistor T1 may be widened.

The third-first transistor T3-1, the third-second transistor T3-2, the fourth-first transistor T4-1, the fourth-second transistor T4-2, the fifth transistor T5, the sixth transistor T6, and the seventh transistor T7 shown in FIG. 3 may be formed to be substantially the same as the second transistor T2 described with reference to FIG. 4. Therefore, descriptions of the third-first transistor T3-1, the third-second transistor T3-2, the fourth-first transistor T4-1, the fourth-second transistor T4-2, the fifth transistor T5, the sixth transistor T6, and the seventh transistor T7 will be omitted.

Figure 7:
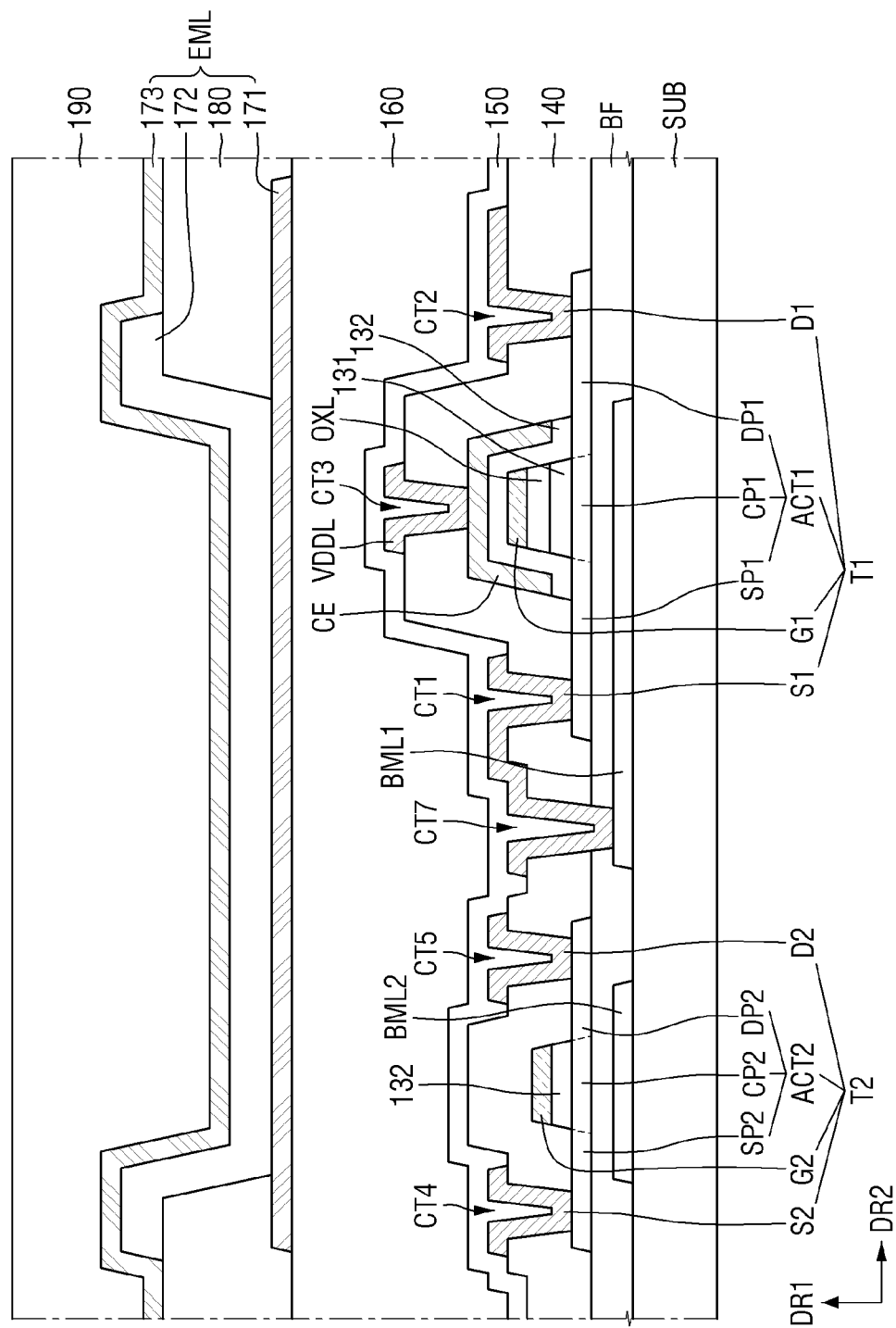
FIG. 7 is a cross-sectional view illustrating another embodiment of the first transistor and the second transistor of FIG. 3.

FIG. 7 is a cross-sectional view illustrating another embodiment of the first transistor and the second transistor of FIG. 3.

An embodiment of FIG. 7 is different from that of FIG. 4 in that light blocking layers BML1 and BML2 are disposed on the substrate SUB and the source electrode S1 of the first transistor T1 is connected to the first light blocking layer BML1. Hereinafter, an overlapping description will be omitted and a configuration with differences will be described.

Referring to FIG. 7, a first light blocking layer BML1 and a second light blocking layer BML2 may be disposed on the substrate SUB. The first light blocking layer BML1 may overlap the channel region CP1 of the first active layer ACT1 in the first direction DR1. The second light blocking layer BML2 may overlap the channel region CP2 of the second active layer ACT2 in the first direction DR1. The first light blocking layer BML1 and the second light blocking layer BML2 may prevent light incident from the substrate SUB from entering the channel region CP1 of the first active layer ACT1 and the channel region CP2 of the second active layer ACT2. Therefore, it is possible to prevent a leakage current caused by light from flowing in the channel region CP1 of the first active layer ACT1 and the channel region CP2 of the second active layer ACT2.

In an embodiment, each of the first light blocking layer BML1 and the second light blocking layer BML2 may be a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

In an embodiment, a seventh contact hole CT7 may be defined in the interlayer-insulating layer 140. The seventh contact hole CT7 may penetrate the interlayer-insulating layer 140 and the buffer layer BF to expose the first light blocking layer BML1. The first source electrode S1 may be connected to the first light blocking layer BML1 through the seventh contact hole CT7.

When the first source electrode S1 is connected to the first light blocking layer BML1 through the seventh contact hole CT7, the first light blocking layer BML1 and the first source electrode S1 have the same voltage. When the first light blocking layer BML1 and the first source electrode S1 have the same potential, the first active layer ACT1 adjacent to the first light blocking layer BML1 in the first direction DR1 may not be activated compared to the first active layer ACT1 adjacent to the first gate electrode G1. That is, the electron mobility of the channel region CP1 of the first active layer ACT1 decreases, and the slope of the driving current curve of the first transistor T1 may be lowered. Accordingly, as shown in FIG. 7, when the first source electrode S1 is connected to the first light blocking layer BML1 through the seventh contact hole CT7, the driving voltage range of the first transistor T1 may be widened, compared to the case where the first light blocking layer BML1 is not included.

Figure 8:
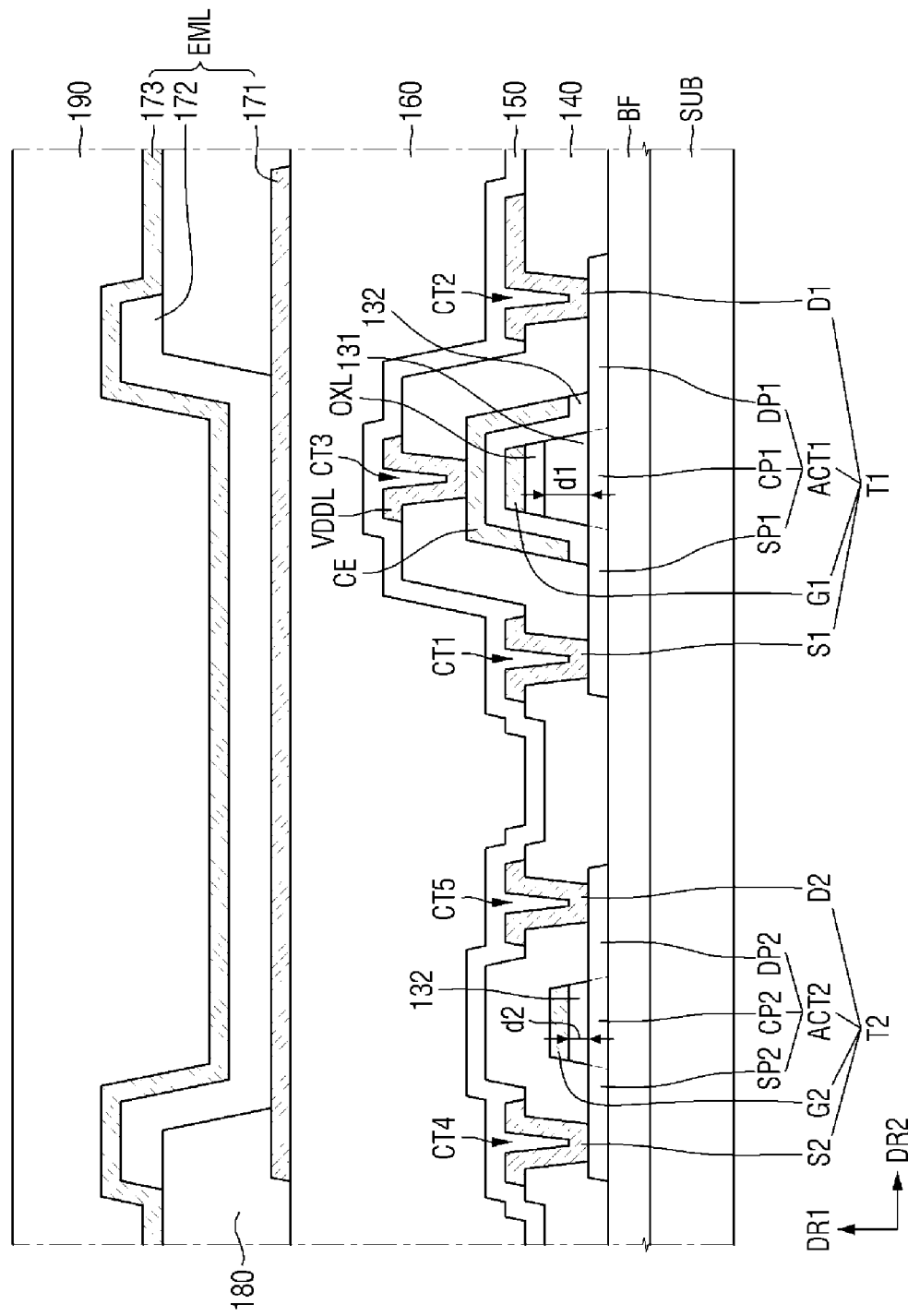
FIG. 8 is a cross-sectional view illustrating still another embodiment of the first transistor and the second transistor of FIG. 3.

FIG. 8 is a cross-sectional view illustrating still another embodiment of the first transistor and the second transistor of FIG. 3.

An embodiment of FIG. 8 is different from that of FIG. 4 in that the first gate insulating layer 131 and the second gate insulating layer 132 on the substrate SUB have different thicknesses in the first direction DR1. Hereinafter, an overlapping description will be omitted and a configuration with differences will be described.

Referring to FIG. 8, the first gate insulating layer 131 overlapping the channel region CP1 of the first active layer ACT1 may have a different thickness in the first direction DR1 from the second gate insulating layer 132 overlapping the channel region CP2 of the second active layer ACT2.

As the distance between the first gate electrode G1 and the first active layer ACT1 increases, the driving voltage range of the first transistor T1 may increase. On the other hand, since the second transistor T2 is the switching transistor, the driving voltage range of the second transistor T2 need not be wide. Therefore, a minimum thickness d1 of the first gate insulating layer 131 in the first direction DR1 may be thicker than a minimum thickness d2 of the second gate insulating layer 132.

As described above, since the minimum thickness d1 of the first gate insulating layer 131 in the first direction DR1 is thicker than the minimum thickness d2 of the second gate insulating layer 132, the distance between the first gate electrode G1 and the first active layer ACT1 is increased, thereby increasing the driving voltage range of the first transistor T1.

Figure 9:
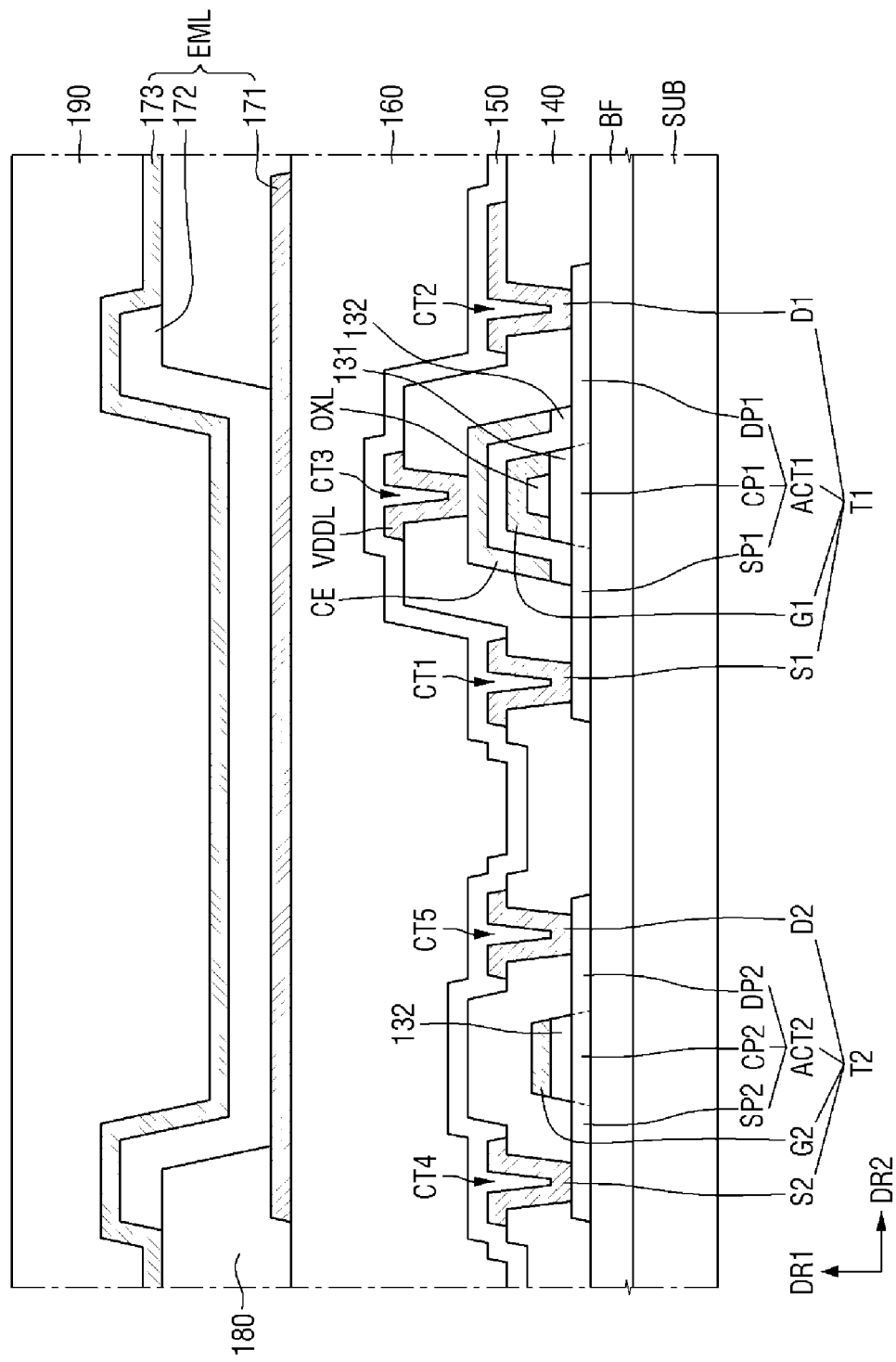
FIG. 9 is a cross-sectional view illustrating a first transistor and a second transistor according to still another embodiment.

FIG. 9 is a cross-sectional view illustrating a first transistor and a second transistor according to still another embodiment.

An embodiment of FIG. 9 is different from that of FIG. 4 in that the size of the first gate electrode G1 is different from the size of the oxide layer OXL. Hereinafter, an overlapping description will be omitted and a configuration with differences will be described.

Referring to FIG. 9, in the first transistor T1 according to an embodiment, the width of the oxide layer OXL in the second direction DR2 may be narrower than the width of the first gate electrode G1. Both sides of the oxide layer OXL may contact the first gate electrode G1 without being exposed. The first gate electrode G1 may be disposed to cover the outer surface of the oxide layer OXL. Accordingly, a portion of the bottom surface of the first gate electrode G1 may contact the first gate insulating layer 131.

Further, according to an embodiment, the width of the oxide layer OXL in the second direction DR2 may be narrower than the width of the channel region CP1 of the first active layer ACT1. The channel region CP1 of the first active layer ACT1 may behave substantially the same width as the first gate electrode G1 in the second direction DR2. When the oxide layer OXL has a narrower width than the first gate electrode G1, the width of the oxide layer OXL in the second direction DR2 may be narrower than the width of the channel region CP1 of the first active layer ACT1.

Since the first gate electrode G1 and the oxide layer OXL have different etching ratios with respect to an etching solution, when they are etched in the same process, the oxide layer OXL may be more etched. Accordingly, the side surface of the oxide layer OXL may be recessed compared to the side surface of the first gate electrode G1. When the side surface of the oxide layer OXL is recessed, the interlayer-insulating layer 140 formed in a subsequent process is not deposited on the side surface of the oxide layer OXL, such that a crack may occur. This may cause deterioration of device characteristics and reliability of the first transistor T1.

According to an embodiment, the first gate electrode G1 may have a wider width in the second direction DR2 than the oxide layer OXL. Accordingly, it is possible to prevent the crack from occurring in the interlayer-insulating layer 140, and further, to secure the structural stability of the first transistor T1, thereby improving device characteristics and reliability. Furthermore, the channel region CP1 of the first active layer ACT1 may have the same width as the first gate electrode G1 and a wider width than the oxide layer OXL in the second direction DR2. Since the oxide layer OXL may overlap at least the channel region CP1 of the first active layer ACT1 in a plan view, oxygen (O) is injected from the oxide layer OXL into the first active layer ACT1. As a result, a wide range of driving voltage may be secured.

Hereinafter, a method for manufacturing the display device including the first transistor T1 and the second transistor T2 according to the above-described embodiment will be described.

Figure 10:
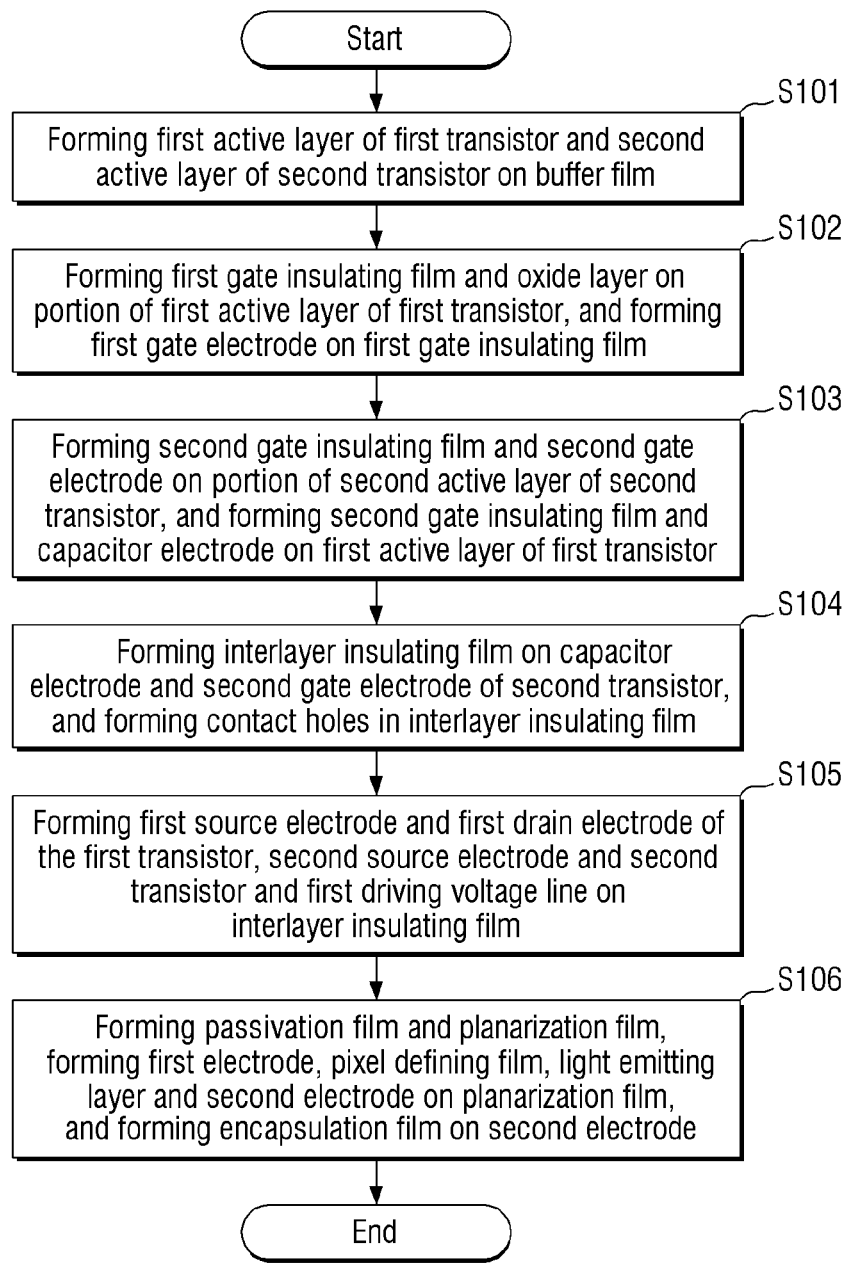
FIG. 10 is a flowchart illustrating a method for manufacturing the display device according to an exemplary embodiment.

FIG. 10 is a flowchart illustrating a method for manufacturing the display device according to an exemplary embodiment. FIGS. 11 to 20 are cross-sectional views of the first transistor and the second transistor for describing a method for manufacturing the display device according to an exemplary embodiment.

Hereinafter, a method for manufacturing the display device according to an exemplary embodiment will be described in detail with reference to FIGS. 10 to 20.

Figure 11:
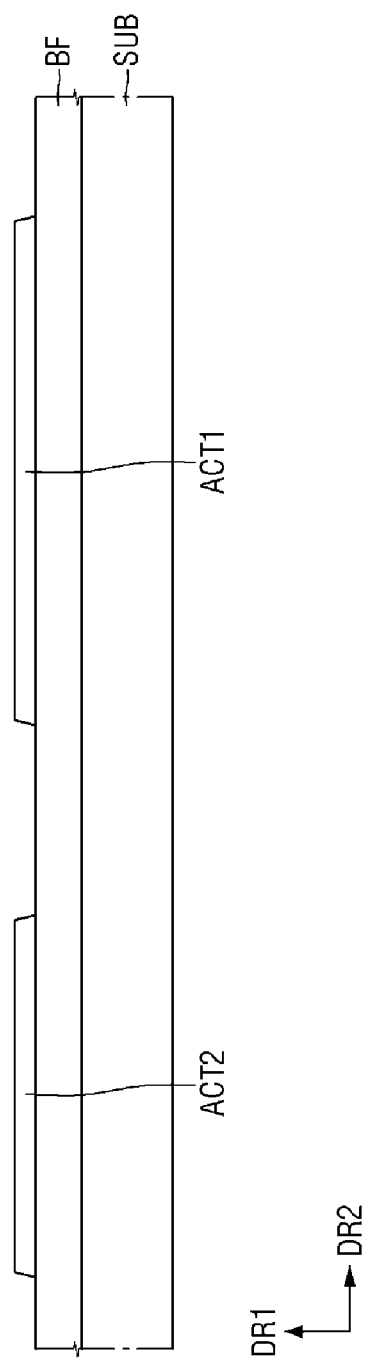
FIGS. 11 to 20 are cross-sectional views of the first transistor and the second transistor for describing a method for manufacturing the display device according to an exemplary embodiment.

First, referring to FIG. 11, the buffer layer BF is formed on the substrate SUB, and the first active layer ACT1 of the first transistor T1 and the second active layer ACT2 of the second transistor T2 are formed on the buffer layer BF (step S101 in FIG. 10).

The buffer layer BF may be formed on the entire substrate SUB. The buffer layer BF may be formed by a chemical vapor deposition ("CVD") method, but the invention is not limited thereto.

Next, an active material layer is formed on the buffer layer BF, and a photoresist pattern is formed on the active material layer. The active material layer may be formed by a sputtering method or metal organic chemical vapor deposition ("MOCVD"). However, it is the invention not limited thereto, and in some cases, the active material layer may be formed by atomic layer deposition ("ALD").

Next, the active material layer that is not covered by the photoresist pattern is etched to form the first active layer ACT1 and the second active layer ACT2. Then, the photoresist pattern may be removed by a strip process.

Figure 12:
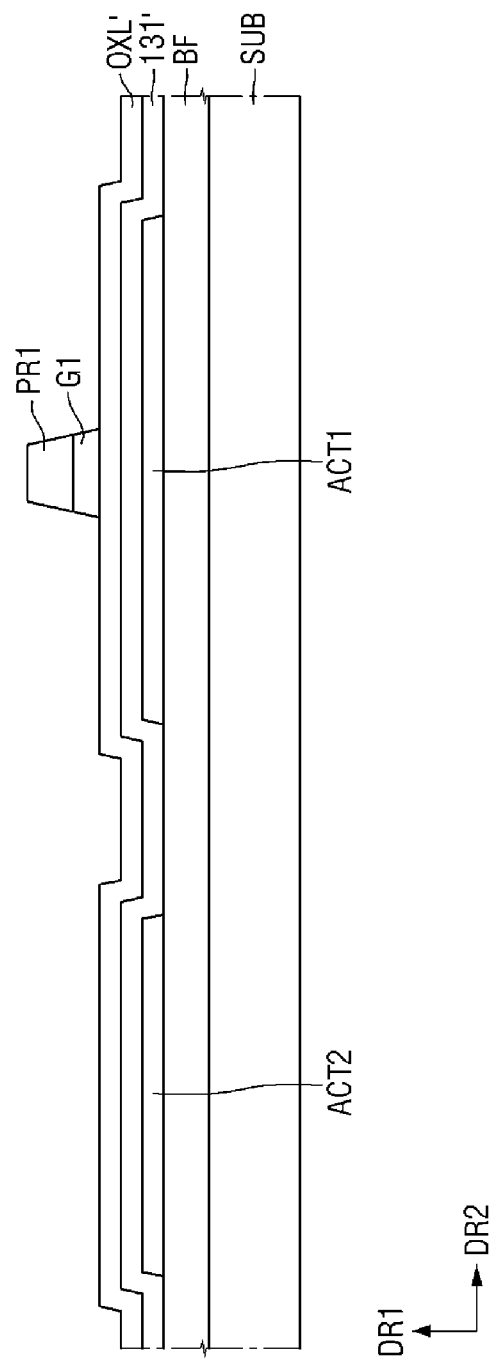
Figure 13:
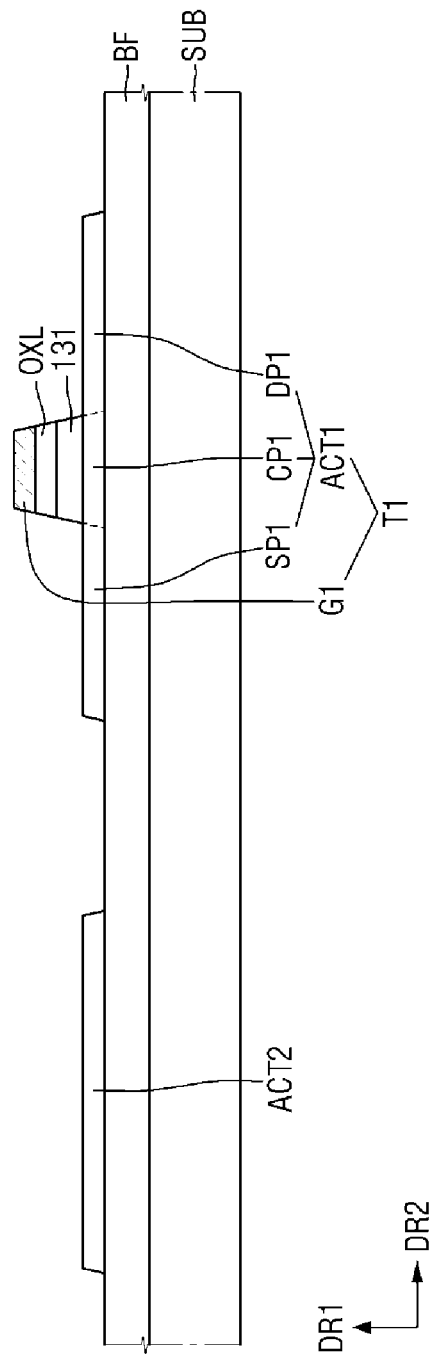

Thereafter, as shown in FIGS. 12 and 13, the first gate insulating layer 131 is formed on a portion of the first active layer ACT1 of the first transistor T1, the oxide layer OXL is formed on the first gate insulating layer 131, and the first gate electrode G1 is formed on the oxide layer OXL (step S102 in FIG. 10).

Specifically, as shown in FIG. 12, a first gate insulating material layer 131' is formed on the substrate SUB on which the first active layer ACT1 and the second active layer ACT2 are formed. The first gate insulating material layer 131' may be formed on the buffer layer BF that is not covered by the first active layer ACT1 and the second active layer ACT2. The first gate insulating material layer 131' may be formed of an inorganic layer, e.g., silicon oxide. The first gate insulating material layer 131' may be formed by a CVD method.

Subsequently, an oxide material layer OXL' is formed on the first gate insulating material layer 131'. The oxide material layer OXL' may be disposed on the entire first gate insulating material layer 131'. The oxide material layer OXL' may include the same material as the aforementioned active material layer. The oxide material layer OXL' may be formed by a sputtering method or metal organic chemical vapor deposition (MOCVD). However, the invention is not limited thereto, and in some cases, the oxide material layer OXL' may be formed by atomic layer deposition (ALD).

Next, the oxide material layer OXL' is heat-treated. The oxide material layer OXL' may inject oxygen into the first gate insulating material layer 131' formed thereunder by the heat treatment process.

Subsequently, a first gate metal layer is stacked on the oxide material layer OXL', a photoresist pattern PR1 is formed on the first gate metal layer, and the first gate metal layer is patterned to form the first gate electrode G1. The first gate metal layer may be formed by a sputtering method or a CVD method.

Next, as shown in FIG. 13, the first gate insulating material layer 131' and the oxide material layer OXL' is thy-etched using the first gate electrode G1 as a mask to form the first gate insulating layer 131 and the oxide layer OXL. At this time, a portion of the first active layer ACT1 that is not covered by the first gate insulating layer 131 may be exposed to the plasma of the dry etching process to become conductive as the first conductive region SP1. In addition, another portion of the first active layer ACT1 that is not covered by the first gate insulating layer 131 may be exposed to the plasma of the dry etching process to become conductive as the second conductive region DP1.

In some embodiments, the first gate electrode G1 and the oxide layer OXL may be simultaneously etched to be patterned. The first gate electrode G1 and the oxide layer OXL may have the same etching ratio with respect to an etching solution, such that the sizes of the first gate electrode G1 and the oxide layer OXL may be substantially the same.

Next, as illustrated in FIGS. 14 to 18, the second gate insulating layer 132 and the second gate electrode G2 are formed on a portion of the second active layer ACT2 of the second transistor T2, and the second gate insulating layer 132 and the capacitor electrode CE are formed on the first gate electrode G1 of the first transistor T1 (step S103 of FIG. 10).

Figure 14:
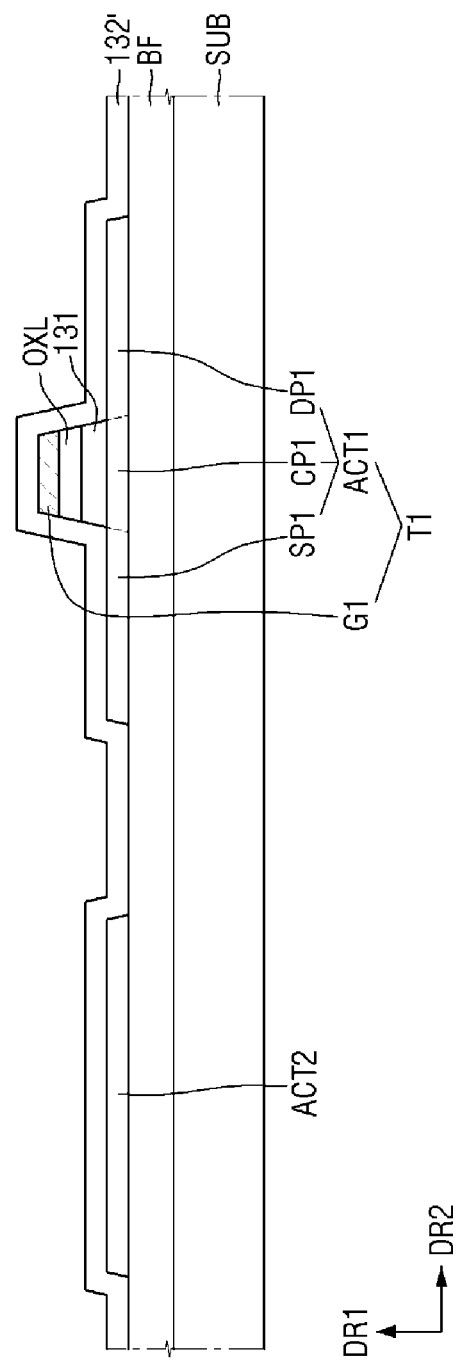

Specifically, referring to FIG. 14, a second gate insulating material layer 132' is formed on the substrate SUB on which the first gate electrode G1 and the second active layer ACT2 are formed. The second gate insulating material layer 132' may be formed on the side surfaces of the first gate insulating layer 131 and the side surfaces of the oxide layer OXL. In addition, the second gate insulating material layer 132' may be formed on the first active layer ACT1 that is not covered by the first gate insulating layer 131. Further, the second gate insulating material layer 132' may be formed on the second active layer ACT2. Furthermore, the second gate insulating material layer 132' may be formed on the buffer layer BF that is not covered by the first active layer ACT1 and the second active layer ACT2. The second gate insulating material layer 132' may be formed using a CVD method.

Figure 15:
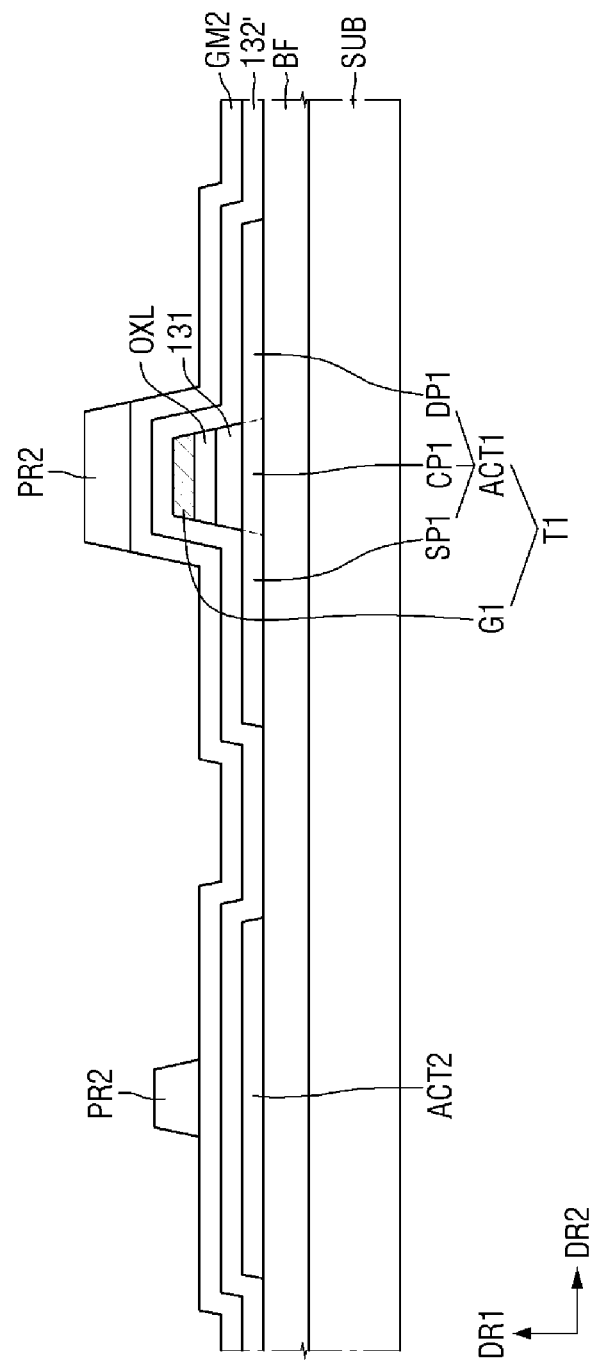

Next, referring to FIG. 15, a second gate metal layer GM2 is formed on the second gate insulating material layer 132'. The second gate metal layer GM2 may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof. The second gate metal layer GM2 may be formed by a sputtering method or a CVD method.

Subsequently, a photoresist pattern PR2 is formed on the second gate metal layer GM2. The photoresist pattern PR2 may overlap a portion of the second active layer ACT2 in the first direction DR1. The photoresist pattern PR2 may overlap the first gate electrode G1 in the first direction DR1.

Figure 16:
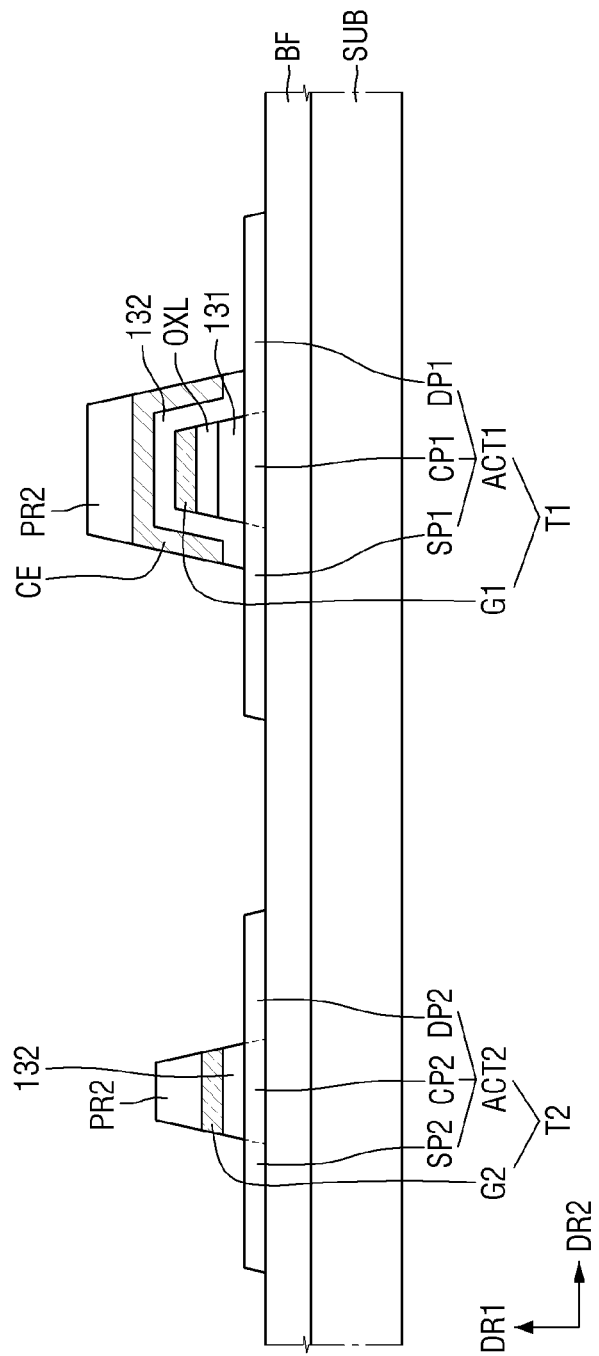

Next, referring to FIG. 16, the second gate metal layer GM2 that is not covered by the photoresist pattern PR2 is wet- or dry-etched to form the second gate electrode G2 and the capacitor electrode CE. Thereafter, using the second gate electrode G2 and the capacitor electrode CE as masks, the second gate insulating material layer 132' is dry-etched to form the second gate insulating layer 132. At this time, a portion of the second active layer ACT2 that is not covered by the second gate insulating layer 132 may be exposed to the plasma of the dry etching process to become conductive as the first conductive region SP2. In addition, another portion of the second active layer ACT2 that is not covered by the second gate insulating layer 132 may be exposed to the plasma of the dry etching process to become conductive as the second conductive region DP2.

Figure 17:
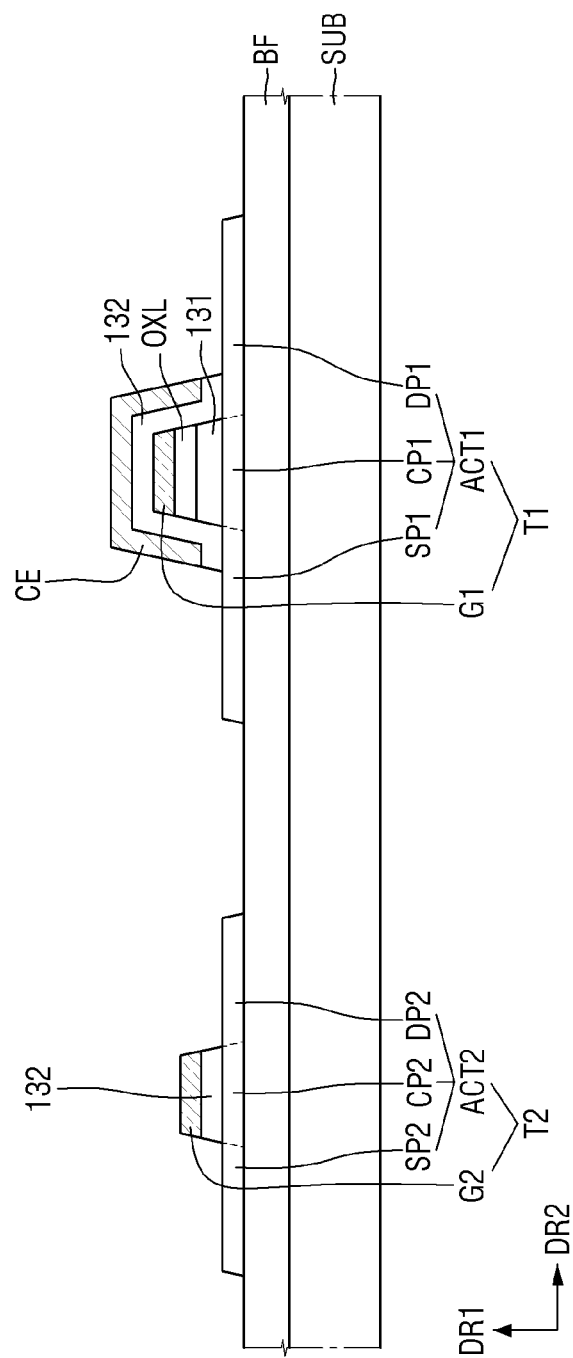

Next, referring to FIG. 17, the photoresist pattern PR2 may be removed by a strip process.

Figure 18:
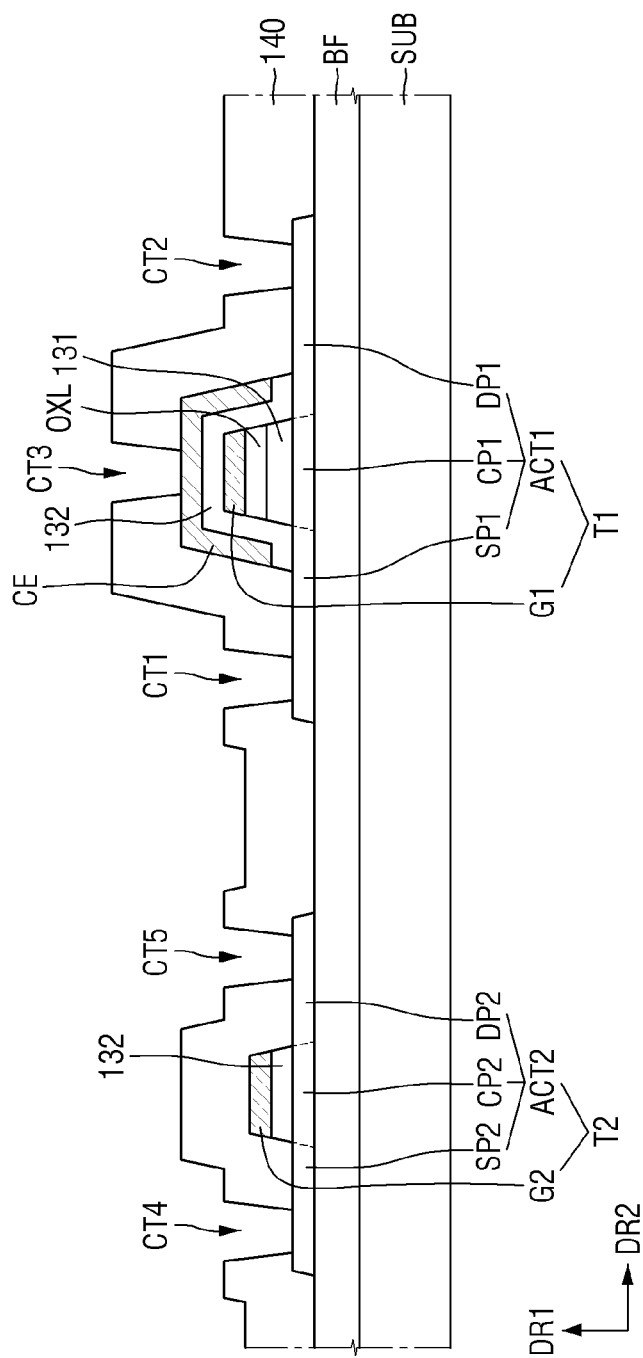

Subsequently, as shown in FIG. 18, the interlayer-insulating layer 140 is formed on the second gate electrode G2 of the second transistor T2 and the capacitor electrode CE, and the contact holes CT1 to CT5 are defined in the interlayer-insulating layer 140 (step S104 in FIG. 10).

Specifically, as shown in FIG. 18, the interlayer-insulating layer 140 is formed on the substrate SUB on which the second gate electrode G2 of the second transistor T2 and the capacitor electrode CE are formed. The interlayer-insulating layer 140 is formed on the side surfaces of the second gate insulating layer 132. Further, the interlayer-insulating layer 140 may be formed on the first active layer ACT1 and the second active layer ACT2 that are not covered by the second gate insulating layer 132. Furthermore, the interlayer-insulating layer 140 may be formed on the buffer layer BF that is not covered by the first active layer ACT1 and the second active layer ACT2. The interlayer-insulating layer 140 may be formed of an inorganic layer, e.g., silicon oxide. The interlayer-insulating layer 140 may be formed by a CVD method.

Subsequently, a photoresist pattern is formed on the interlayer-insulating layer 140, and the interlayer-insulating layer 140 is etched using the photoresist pattern as a mask to form the contact holes CT1 to CT5.

The first contact hole CT1 may penetrate the interlayer-insulating layer 140 to expose the first conductive region SP1 of the first active layer ACT1. The second contact hole CT2 may penetrate the interlayer-insulating layer 140 to expose the second conductive region DP1 of the first active layer ACT1. The third contact hole CT3 may penetrate the interlayer-insulating layer 140 to expose the capacitor electrode CE. The fourth contact hole CT4 may penetrate the interlayer-insulating layer 140 to expose the first conductive region SP2 of the second active layer ACT2. The fifth contact hole CT5 may penetrate the interlayer-insulating layer 140 to expose the second conductive region DP2 of the second active layer ACT2.

Figure 19:
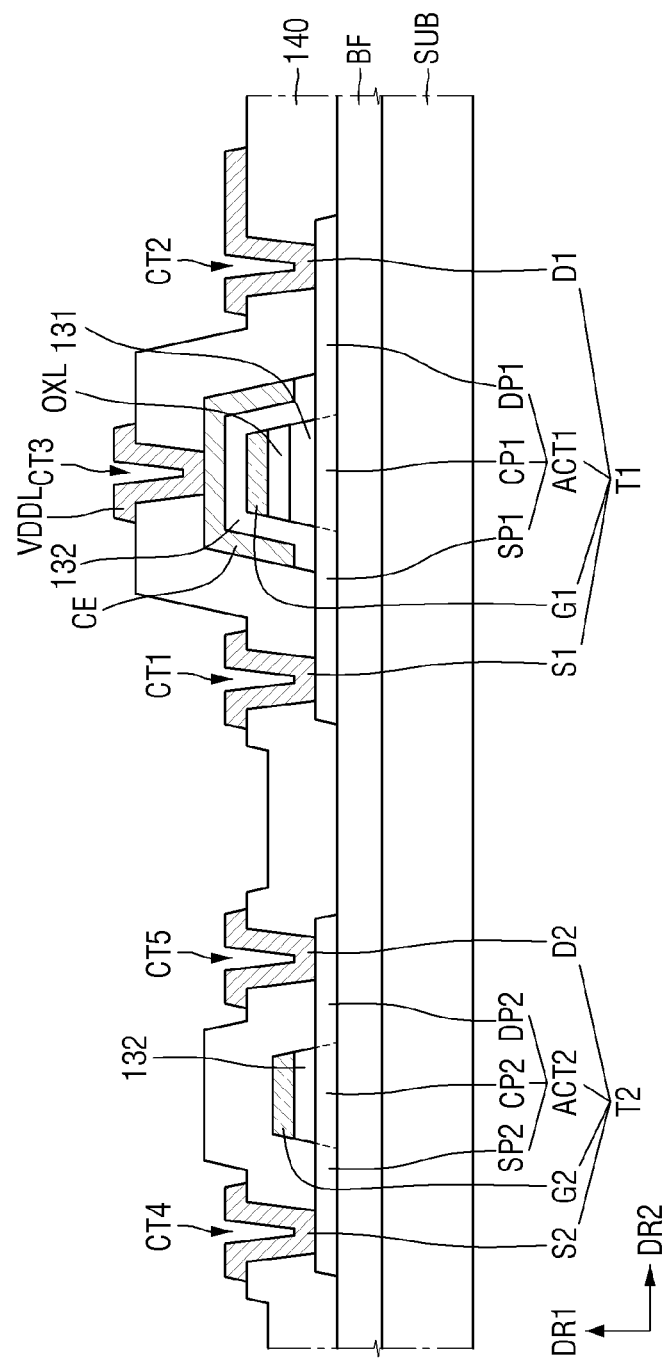

Next, as shown in FIG. 19, the first source electrode S1 and the first drain electrode D1 of the first transistor T1, the second source electrode S2 and the second drain electrode D2 of the second transistor T2, and the first driving voltage line VDDL are formed on the interlayer-insulating layer 140 (step S105 in FIG. 10).

Specifically, a source/drain metal layer is formed on the substrate SUB on which the interlayer-insulating layer 140 is formed. The source/drain metal layer may be formed of a single layer or multiple layers composed of any one or an alloy of molybdenum (Mo), aluminum (Al), chromium (Cr), gold (Au), titanium (Ti), nickel (Ni), neodymium (Nd) and copper (Cu). The source/drain metal layer may be formed by a sputtering method or a CVD method.

Subsequently, a photoresist pattern is formed on the source/drain metal layer, and the source/drain metal layer is patterned using the photoresist pattern to form the first source electrode S1, the first drain electrode D1, the second source electrode S2, the second drain electrode D2, and the first driving voltage line VDDL.

The first source electrode S1 may be connected to the first conductive region SP1 through the first contact hole CT1. The first drain electrode D1 may be connected to the second conductive region DP1 through the second contact hole CT2. The first driving voltage line VDDL may be connected to the capacitor electrode CE through the third contact hole CT3. The second source electrode S2 may be connected to the first conductive region SP2 through the fourth contact hole CT4. The second drain electrode D2 may be connected to the second conductive region DP2 through the fifth contact hole CT5.

Figure 20:
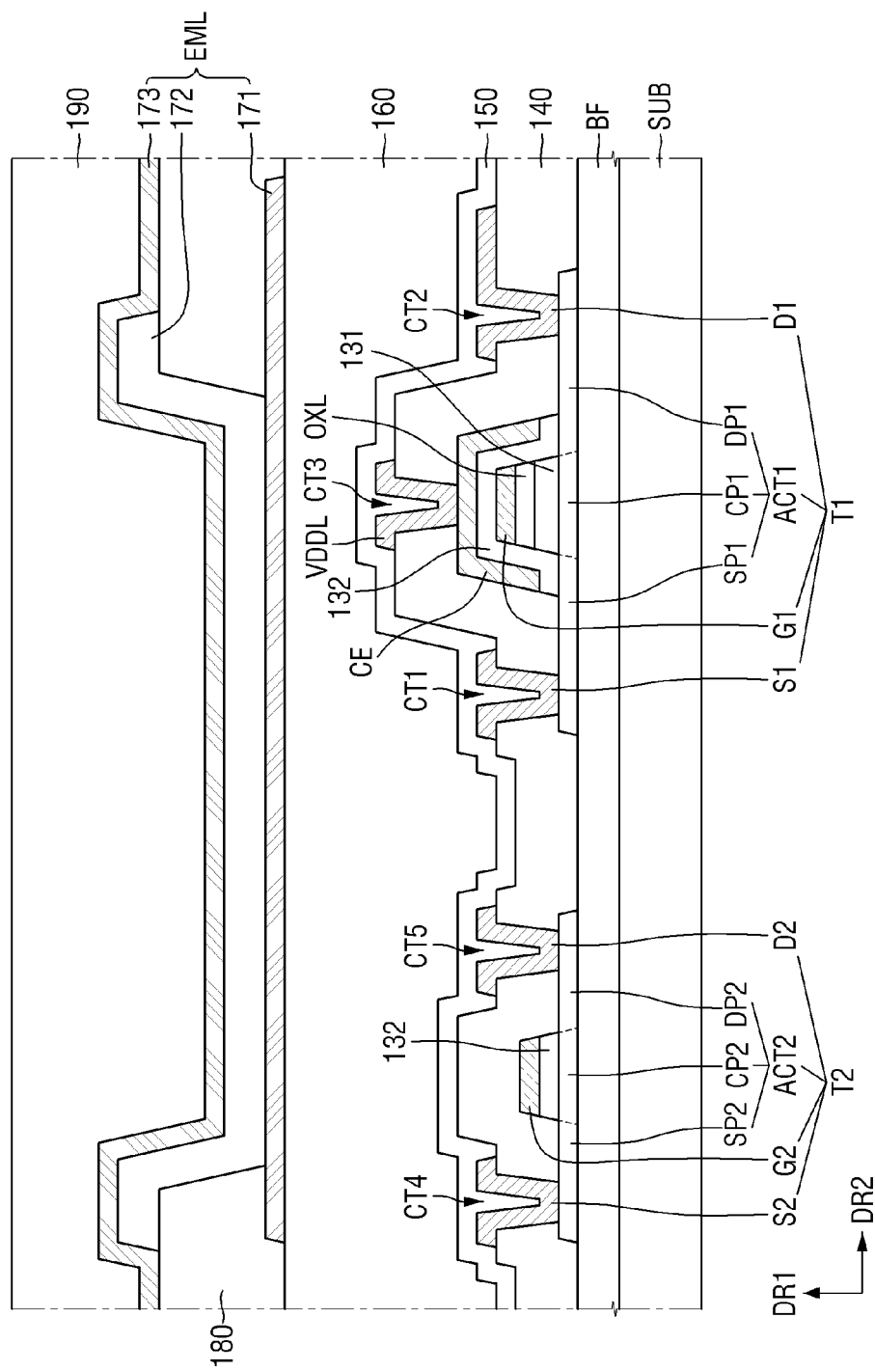

Next, as shown in FIG. 20, the passivation layer 150 and the planarization layer 160 are formed, and the first electrode 171, the pixel defining layer 180, the light emitting layer 172, and the second electrode 173 are formed on the planarization layer 160, and the encapsulation layer 190 is formed on the second electrode 173 (step S106 in FIG. 10).

Specifically, referring to FIG. 20, the passivation layer 150 is formed on the substrate SUB on which the first source electrode S1, the first drain electrode D1, the second source electrode S2, the second drain electrode D2, and the first driving voltage line VDDL are formed. The passivation layer 150 may be formed on the interlayer-insulating layer 140 that is not covered by the first source electrode S1, first drain electrode D1, the second source electrode S2, the second drain electrode D2, and the first driving voltage line VDDL. The passivation layer 150 may be formed by a CVD method. The passivation layer 150 may be formed over the entire substrate SUB.

Next, the planarization layer 160 is formed on the passivation layer 150, and a first metal layer is formed on the planarization layer 160. Then, a photoresist pattern is formed on the first metal layer, and the first metal layer is etched using the photoresist pattern as a mask to form the first electrode 171.

Next, the pixel defining layer 180 is formed to cover the edge of the first electrode 171. Subsequently, the light emitting layer 172 is formed on the pixel defining layer 180 and the first electrode 171 that is not covered by the pixel defining layer 180, and the second electrode 173 is formed on the light emitting layer 172.

Subsequently, the encapsulation layer 190 is formed on the second electrode 173. The encapsulation layer 190 may include at least one inorganic layer to prevent oxygen or moisture from penetrating into the light emitting layer 172 and the second electrode 173. In addition, the encapsulation layer 190 may include at least one organic layer to protect the light emitting layer 172 from foreign matter such as dust.

The display device according to an embodiment may be manufactured through the processes described above. The manufacture of the display device may include a process of forming the oxide layer OXL only on the first active layer ACT1 of the first transistor T1, and the second transistor T2 may not include the oxide layer OXL. The process of forming the oxide layer OXL may include a process of forming the oxide material layer OXL' and heat-treating it to form the oxide layer OXL. In the heat treatment process, oxygen (O) may be supplied to the first gate insulating layer 131 disposed under the oxide layer OXL to be injected into the first active layer ACT1 of the first transistor T1. However, the disclosure according to the invention is not limited thereto, and the heat treatment process may be performed after forming the oxide layer OXL by patterning the oxide material layer OXL' in another exemplary embodiment.

In addition, the first gate insulating layer 131 and the second gate insulating layer 132 may have different thicknesses from each other. The minimum thickness of the first gate insulating layer 131 in the first direction DR1 may be greater than the minimum thickness of the second gate insulating layer 132.

Figure 21:
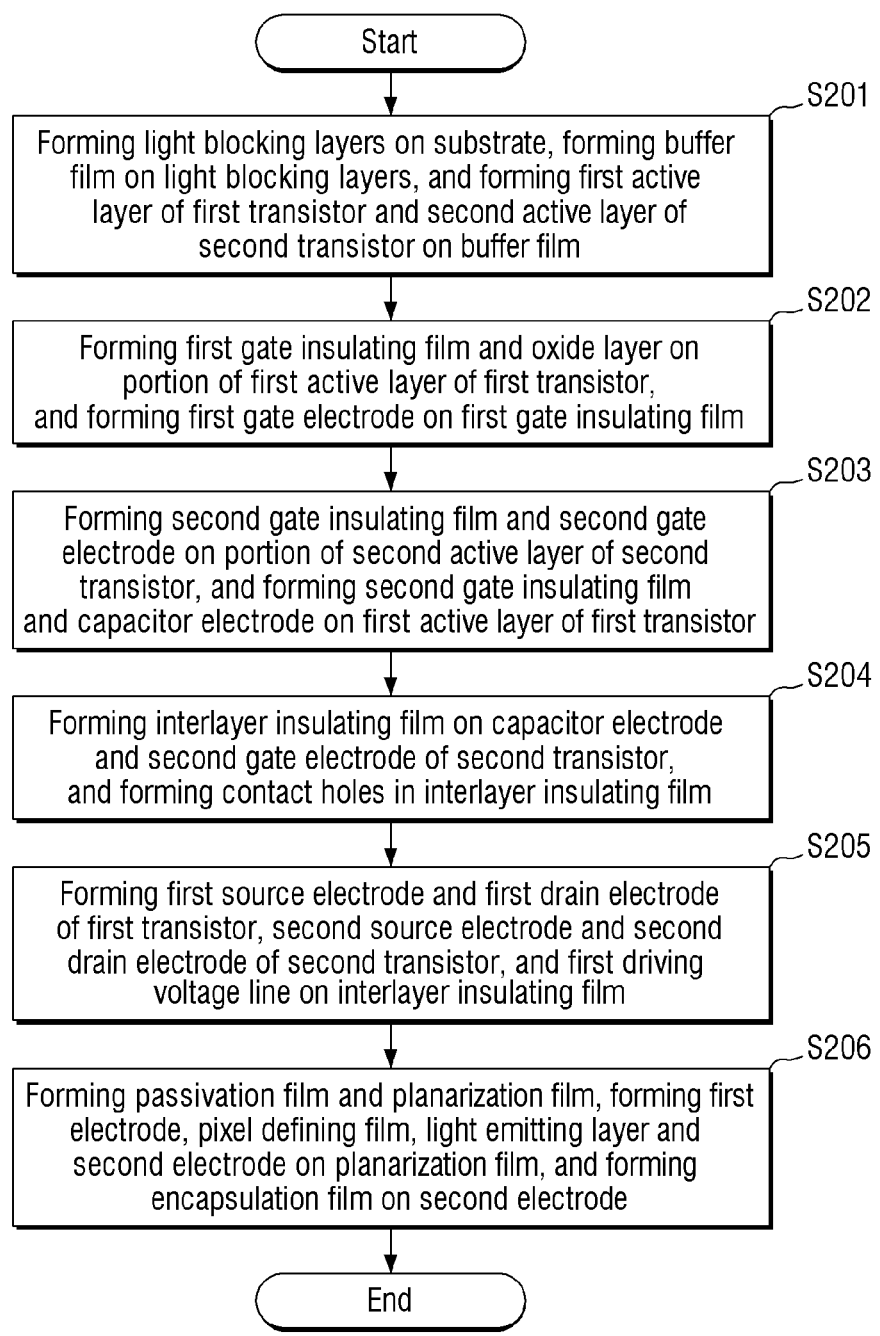
FIG. 21 is a flowchart illustrating a method for manufacturing the display device according to another embodiment.

FIG. 21 is a flowchart illustrating a method for manufacturing the display device according to another embodiment.

Figure 22:
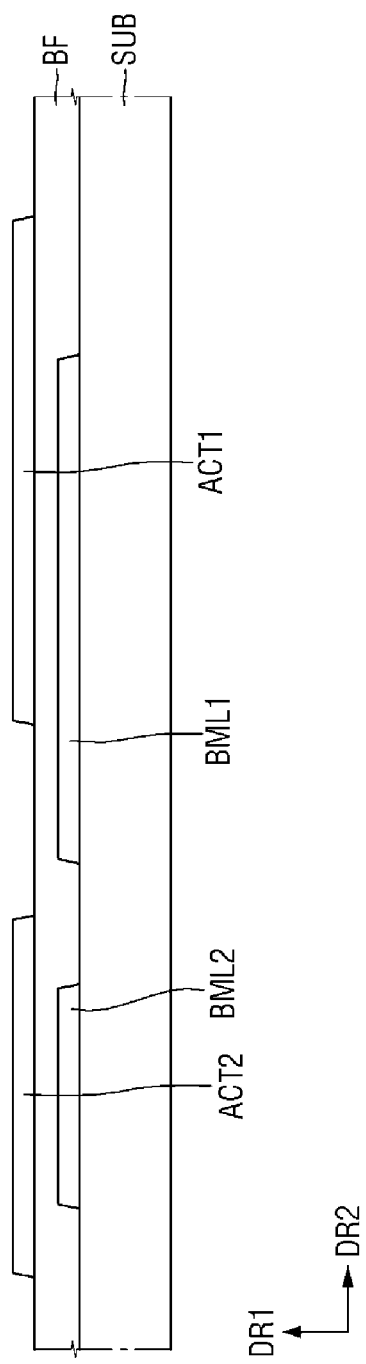
FIGS. 22 to 24 are cross-sectional views of the first transistor and the second transistor, which show steps S201, S204, and S205 of FIG. 21.
Figure 23:
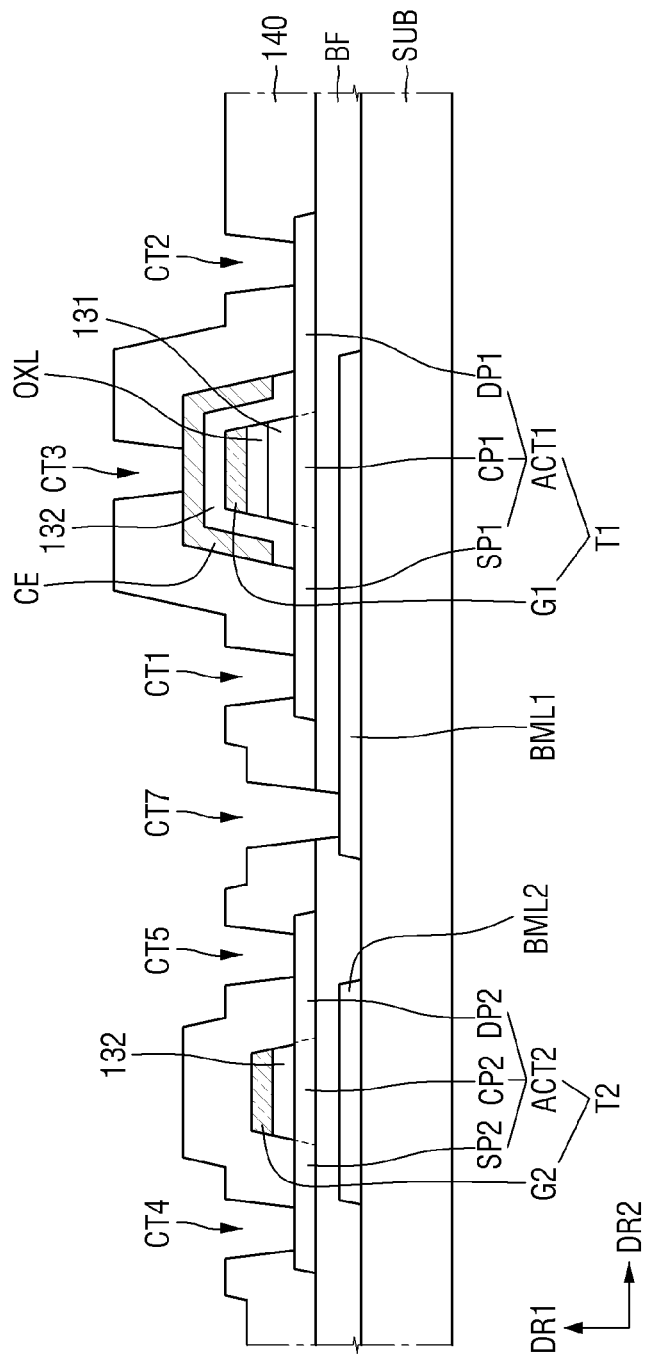
Figure 24:
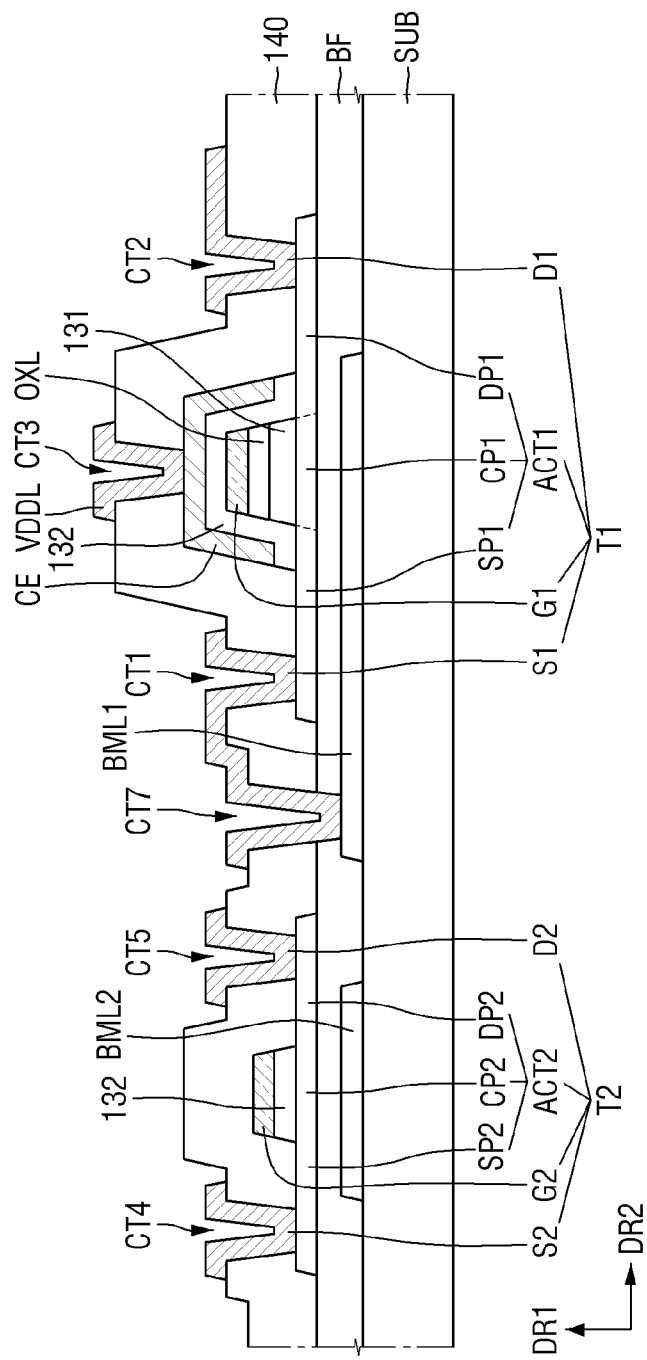

FIG. 21 is a flowchart showing a method for manufacturing a display device according to another embodiment. FIGS. 22 to 24 are cross-sectional views of the first transistor and the second transistor, which show steps S201, S204, and S205 of FIG. 21.

Hereinafter, a method for manufacturing a display device according to another embodiment will be described in detail with reference to FIGS. 21 to 24.

First, as shown in FIG. 22, the light blocking layers BML1 and BML2 are formed on the substrate SUB, the buffer layer BF is formed on the light blocking layers BML1 and BML2, and the first active layer ACT1 of the first transistor T1 and the second active layer ACT2 of the second transistor T2 are formed on the buffer layer BF (step S201 in FIG. 21).

Specifically, a light blocking material layer is formed on the substrate SUB, a photoresist pattern is formed on the light blocking material layer, and the light blocking material layer is patterned to form the first light blocking layer BML1 and the second light blocking layer BML2. The light blocking material layer may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof. The light blocking material layer may be formed by a sputtering method or a MOCVD method.

Subsequently, the buffer layer BF is formed on the substrate SUB on which the first light blocking layer BML1 and the second light blocking layer BML2 are formed. The buffer layer BF may be formed on the substrate SUB that is not covered by the first light blocking layer BML1 and the second light blocking layer BML2. Subsequently, since a process of forming the first active layer ACT1 of the first transistor T1 and the second active layer ACT2 of the second transistor T2 on the buffer layer BF in step S201 of FIG. 20 is substantially the same as in the step S101 of FIG. 10, a description thereof will be omitted. In addition, steps S202 and S203 of FIG. 21 are substantially the same as the steps S102 and S103 of FIG. 10, and thus a description thereof will be omitted.

Next, as shown in FIG. 23, the interlayer-insulating layer 140 is formed on the second gate electrode G2 of the second transistor T2 and the capacitor electrode CE, and the contact holes CT1 to CT5 and CT7 are formed in the interlayer-insulating layer 140 (step S204 in FIG. 21).

Step S204 of FIG. 21 is substantially the same as the step S104 of FIG. 10 except for the seventh contact hole CT7. The seventh contact hole CT7 may be a hole penetrating the interlayer-insulating layer 140 and the buffer layer BF to expose the first light blocking layer BML1.

Next, as shown in FIG. 24, the first source electrode S1 and the first drain electrode D1 of the first transistor T1 and the second source electrode S2 and the second drain electrode D2 of the second transistor T2 and the first driving voltage line VDDL are formed on the interlayer-insulating layer 140 (step S205 in FIG. 21). Step S205 of FIG. 21 is substantially the same as the step S105 of FIG. 10 except that the first source electrode S1 is connected to the first light blocking layer BML1 through the seventh contact hole CT7. In addition, since step S206 of FIG. 21 is substantially the same as the step S106 of FIG. 10, a description thereof will be omitted.

Through the above-described processes, the display device according to another embodiment may be manufactured. In the display device, the first source electrode S1 is connected to the first light blocking layer BML1 through the seventh contact hole CT7, such that the first transistor T1 may have a wide driving voltage range compared to the case where the first light blocking layer BML1 is not included.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed is:

1. A display device comprising:
    a substrate;
    a first active layer of a first transistor and a second active layer of a second transistor which are disposed on the substrate;
    a first gate insulating layer disposed on the first active layer;
    an oxide layer disposed on the first gate insulating layer and including an oxide semiconductor;
    a first gate electrode disposed on the oxide layer;
    a second gate insulating layer disposed on the first gate electrode and the second active layer; and
    a second gate electrode which overlaps the second active layer in a thickness direction of the substrate and is disposed on the second gate insulating layer,
    wherein the oxide layer overlaps the first active layer and does not overlap the second active layer in the thickness direction.

2. The display device of claim 1, wherein the first gate insulating layer overlaps the first active layer and does not overlap the second active layer in the thickness direction.

3. The display device of claim 2, wherein each of the first active layer and the second active layer include an oxide semiconductor, and the oxide semiconductor includes at least one of indium (In), gallium (Ga), zinc (Zn), tin (Sn), or hafnium (Hf).

4. The display device of claim 3, wherein the oxide semiconductor of the oxide layer includes at least one of indium (In), gallium (Ga), zinc (Zn), tin (Sn), or hafnium (Hf).

5. The display device of claim 4, wherein a hydrogen content of the first active layer is smaller than a hydrogen content of the second active layer, and an oxygen content of the first active layer is greater than an oxygen content of the second active layer.

6. The display device of claim 4, wherein a width of the oxide layer measured in a horizontal direction is the same as a width of the first gate electrode measured in the horizontal direction, and the horizontal direction is perpendicular to the thickness direction.

7. The display device of claim 4, wherein a width of the oxide layer measured in a horizontal direction is smaller than a width of the first gate electrode measured in the horizontal direction, the horizontal direction is perpendicular to the thickness direction, and both side surfaces of the oxide layer are in contact with the first gate electrode.

8. The display device of claim 4, wherein the first active layer includes a first conductive region, a second conductive region, and a channel region disposed between the first conductive region and the second conductive region, and
    the oxide layer overlaps the channel region of the first active layer in the thickness direction.

9. The display device of claim 8, further comprising:
    an interlayer-insulating layer disposed on the first gate electrode and the second gate electrode, and
    wherein the first transistor includes:
        a first source electrode disposed on the interlayer-insulating layer and in contact with the first conductive region, and
        a first drain electrode disposed on the interlayer-insulating layer and in contact with the second conductive region.

10. The display device of claim 9, wherein the first transistor further includes a first light blocking layer disposed under the first active layer, and the first source electrode is in contact with the first light blocking layer.

11. The display device of claim 4, wherein the second gate insulating layer is in contact with a top surface of the second active layer, and the second gate electrode is in contact with a top surface of the second gate insulating layer.

12. The display device of claim 2, wherein a minimum thickness of the first gate insulating layer is greater than a minimum thickness of the second gate insulating layer in the thickness direction.

13. The display device of claim 2, wherein a hydrogen concentration of the first gate insulating layer is lower than a hydrogen concentration of the second gate insulating layer.

14. The display device of claim 2, wherein the second gate insulating layer is disposed on a top surface and side surfaces of the first gate electrode, and disposed on side surfaces of the first gate insulating layer.

15. A method for manufacturing a display device, the method comprising:
    forming a first active layer of a first transistor and a second active layer of a second transistor on a substrate;
    forming a first gate insulating layer and an oxide layer on a channel region of the first active layer, and forming a first gate electrode of the first transistor on the oxide layer; and
    forming a second gate insulating layer on the second active layer and the first gate electrode, and forming a second gate electrode which overlaps a channel region of the second active layer on the second gate insulating layer in a thickness direction of the substrate,
    wherein the oxide layer is an oxide semiconductor and overlaps the first active layer and does not overlap the second active layer in the thickness direction.

16. The method of claim 15, wherein the first gate insulating layer overlaps the first active layer and does not overlap the second active layer in the thickness direction.

17. The method of claim 16, further comprising: before forming the first active layer of the first transistor and the second active layer of the second transistor,
    forming a first light blocking layer and a second light blocking layer on the substrate,
    wherein the first light blocking layer overlaps the first active layer, and the second light blocking layer overlaps the second active layer in the thickness direction.

18. The method of claim 15, wherein forming the first gate insulating layer, the oxide layer, and the first gate electrode includes:
    forming a first gate insulating material layer on the substrate;
    forming an oxide material layer on the first gate insulating material layer;
    forming a first gate electrode on the oxide material layer; and simultaneously etching the oxide material layer and the first gate insulating material layer using the first gate electrode as a mask.

19. The method of claim 18, wherein a width of the first gate electrode measured in a horizontal direction is the same as a width of the oxide layer measured in the horizontal direction, and the horizontal direction is perpendicular to the thickness direction.

20. The method of claim 15, wherein a minimum thickness of the first gate insulating layer is greater than a minimum thickness of the second gate insulating layer in the thickness direction.

* * * * *